US012581761B2

(12) United States Patent
Sekine et al.

(10) Patent No.: US 12,581,761 B2
(45) Date of Patent: Mar. 17, 2026

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventors: Hiroshi Sekine, Kanagawa (JP); Kazuhiro Morimoto, Kanagawa (JP); Junji Iwata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 465 days.

(21) Appl. No.: 18/148,595

(22) Filed: Dec. 30, 2022

(65) Prior Publication Data

US 2023/0215893 A1      Jul. 6, 2023

(30) Foreign Application Priority Data

Jan. 1, 2022   (JP) ................................. 2022-000009
Jan. 1, 2022   (JP) ................................. 2022-000010

(51) Int. Cl.
    *H10F 39/00*            (2025.01)
(52) U.S. Cl.
    CPC ....... *H10F 39/807* (2025.01); *H10F 39/8057* (2025.01); *H10F 39/811* (2025.01)
(58) Field of Classification Search
    CPC .. H10F 39/807; H10F 39/8057; H10F 39/014; H10F 39/18; H10F 39/199;
    (Continued)

(56) References Cited

U.S. PATENT DOCUMENTS 8,648,944 B2    2/2014  Iwata
8,697,500 B2    4/2014  Iwata
         (Continued)

FOREIGN PATENT DOCUMENTS

JP      2018-148097 A      9/2018
JP      2018-157156 A     10/2018
         (Continued)

OTHER PUBLICATIONS

The Examiner's attention is also drawn to U.S. Appl. No. 17/932,778, filed Sep. 16, 2022, Named Inventors: Yu Maehashi, et al.
(Continued)

*Primary Examiner* — Tucker J Wright
(74) *Attorney, Agent, or Firm* — Venable LLP

(57)            ABSTRACT
Photoelectric conversion apparatus including semiconductor layer includes pixel array region and peripheral region. The semiconductor layer has first and second faces. Each pixel includes first semiconductor region of first conductivity type arranged on the first face side and second semiconductor region of second conductivity type arranged on the second face side, and predetermined voltage causing avalanche multiplication operation is supplied between the first semiconductor region and the second semiconductor region. The peripheral region includes third semiconductor region of the first conductivity type arranged on the first face side, fourth semiconductor region of the second conductivity type arranged apart from the third semiconductor region, and fifth semiconductor region of the first conductivity type arranged, close to the third semiconductor region, between the third semiconductor region and the fourth semiconductor region.

19 Claims, 30 Drawing Sheets

(58) Field of Classification Search
CPC ............. H10F 39/8023; H10F 39/8027; H10F
39/8033; H10F 39/8037
See application file for complete search history.

(56) References Cited

U.S. PATENT DOCUMENTS

| | | | |
|---|---|---|---|
| 9,543,340 B2 | 1/2017 | Iwata | |
| 9,979,916 B2 | 5/2018 | Hiyama | |
| 10,009,560 B2 | 6/2018 | Kobayashi | |
| 10,121,816 B2 | 11/2018 | Iwata | |
| 10,186,532 B2 | 1/2019 | Kobayashi | |
| 10,205,894 B2 | 2/2019 | Kawabata | |
| 10,446,601 B2 | 10/2019 | Otake | |
| 10,483,307 B2 | 11/2019 | Sekine | |
| 10,535,688 B2 | 1/2020 | Onuki | |
| 10,580,817 B2 | 3/2020 | Otake | |
| 10,645,322 B2 | 5/2020 | Sekine | |
| 10,771,718 B2 | 9/2020 | Kawabata | |
| 10,804,309 B2 | 10/2020 | Otake | |
| 10,805,563 B2 | 10/2020 | Ikeda | |
| 10,818,715 B2 | 10/2020 | Iwata | |
| 10,833,207 B2 | 11/2020 | Iwata | |
| 10,848,695 B2 | 11/2020 | Miki | |
| 11,056,519 B2 | 7/2021 | Inui | |
| 11,056,520 B2 | 7/2021 | Onuki | |
| 11,094,731 B2 | 8/2021 | Seto | |
| 11,297,273 B2 | 4/2022 | Sekine | |
| 11,393,870 B2 | 7/2022 | Inui | |
| 11,658,197 B2 | 5/2023 | Iwata | |
| 11,855,105 B2 | 12/2023 | Kawahara | |
| 2018/0270405 A1* | 9/2018 | Ota | ...................... H10F 77/959 |
| 2019/0006399 A1 | 1/2019 | Otake et al. | |
| 2019/0267414 A1 | 8/2019 | Otake | |
| 2020/0091208 A1 | 3/2020 | Otake | |
| 2020/0321369 A1 | 10/2020 | Otake | |
| 2021/0296383 A1 | 9/2021 | Inui | |
| 2022/0037380 A1 | 2/2022 | Shinohara | |
| 2022/0093662 A1 | 3/2022 | Shinohara | |
| 2022/0115366 A1 | 4/2022 | Ota | |
| 2023/0038959 A1 | 2/2023 | Sekine | |
| 2023/0053980 A1 | 2/2023 | Shirahige | |

FOREIGN PATENT DOCUMENTS

| | | |
|---|---|---|
| JP | 2018-201005 A | 12/2018 |
| JP | 2021-027277 A | 2/2021 |
| WO | 2020/203222 A1 | 10/2020 |

OTHER PUBLICATIONS

U.S. Appl. No. 18/051,677, filed Nov. 1, 2022, Named Inventor: Hiroshi Sekine.
U.S. Appl. No. 18/145,072, filed Dec. 22, 2022, Named Inventors: Hiroshi Sekine, et al.
U.S. Appl. No. 18/145,076, filed Dec. 22, 2022, Named Inventors: Hiroshi Sekine, et al.
U.S. Appl. No. 18/147,079, filed Dec. 28, 2022, Named Inventors: Hiroshi Sekine, et al.
Office Action dated Oct. 10, 2025, in Japanese Patent Application No. 2022-000009.
Office Action dated Nov. 4, 2025, in Japanese Patent Application No. 2022-000010.

* cited by examiner

F I G. 1
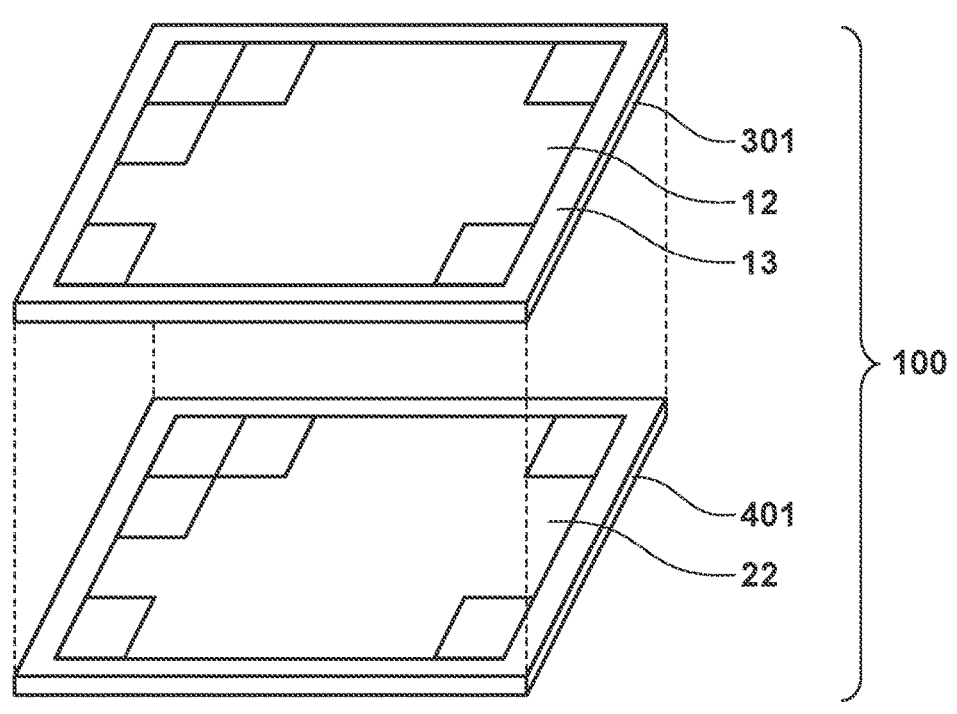
F I G. 2
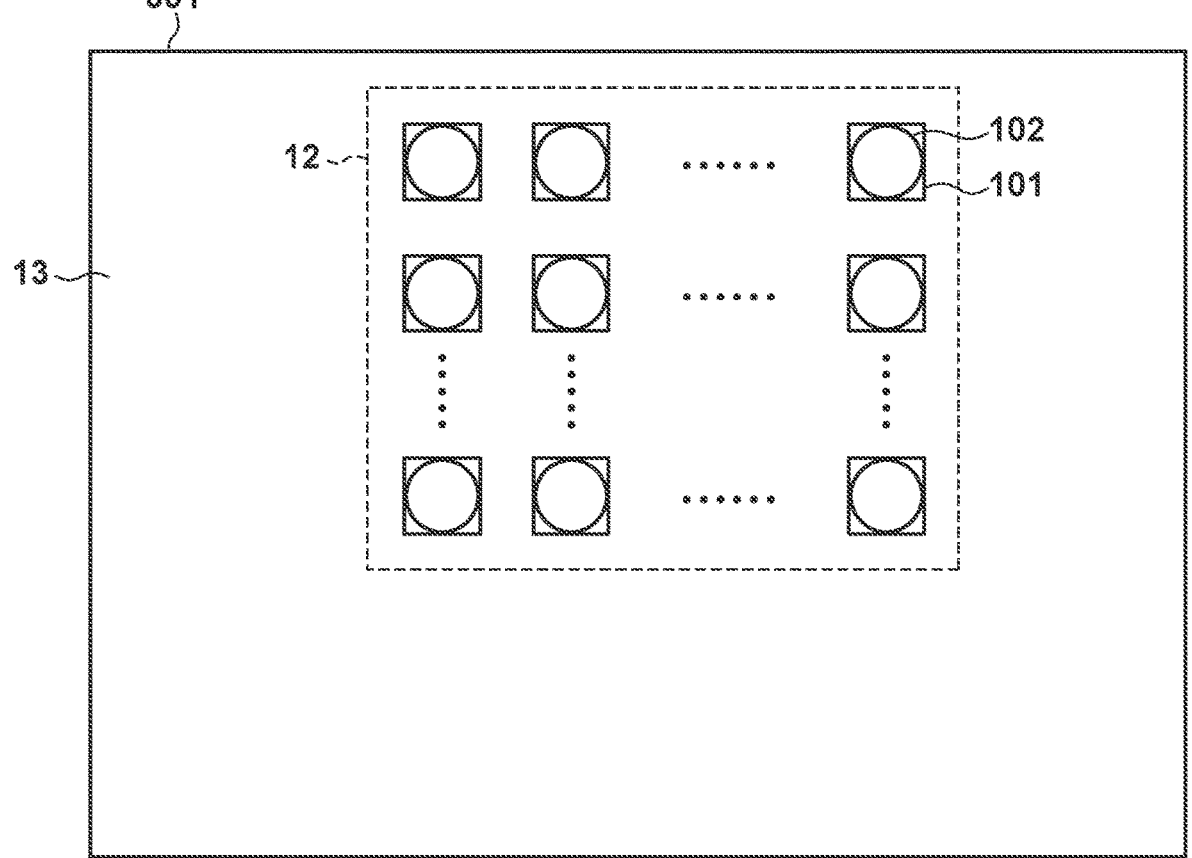

F I G. 5A
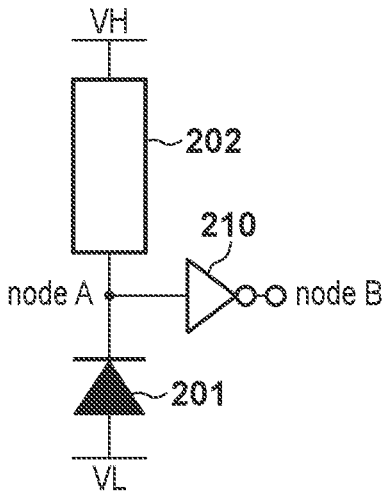
F I G. 5B
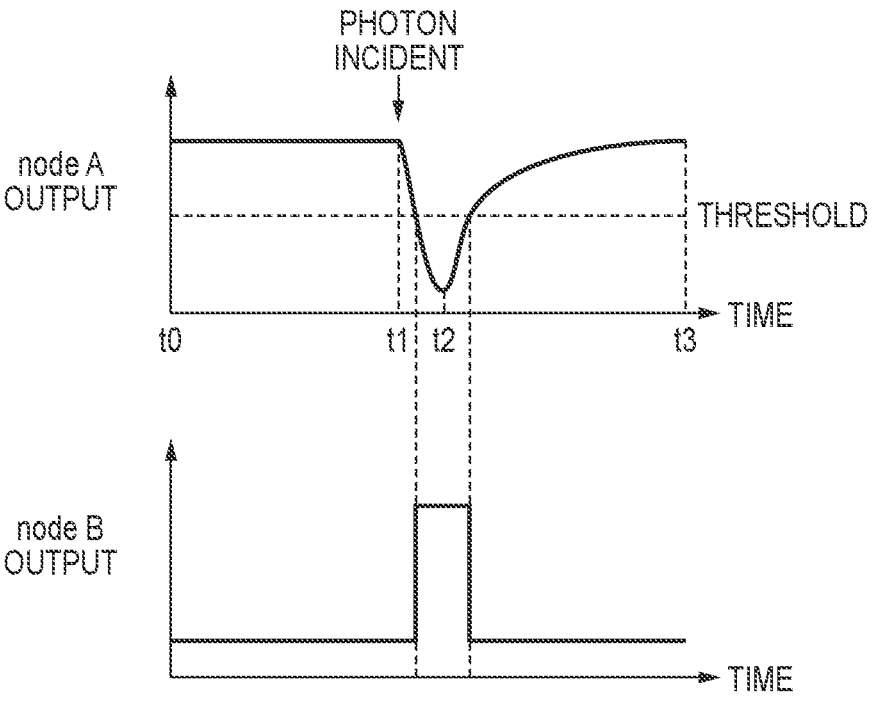

F I G. 6A
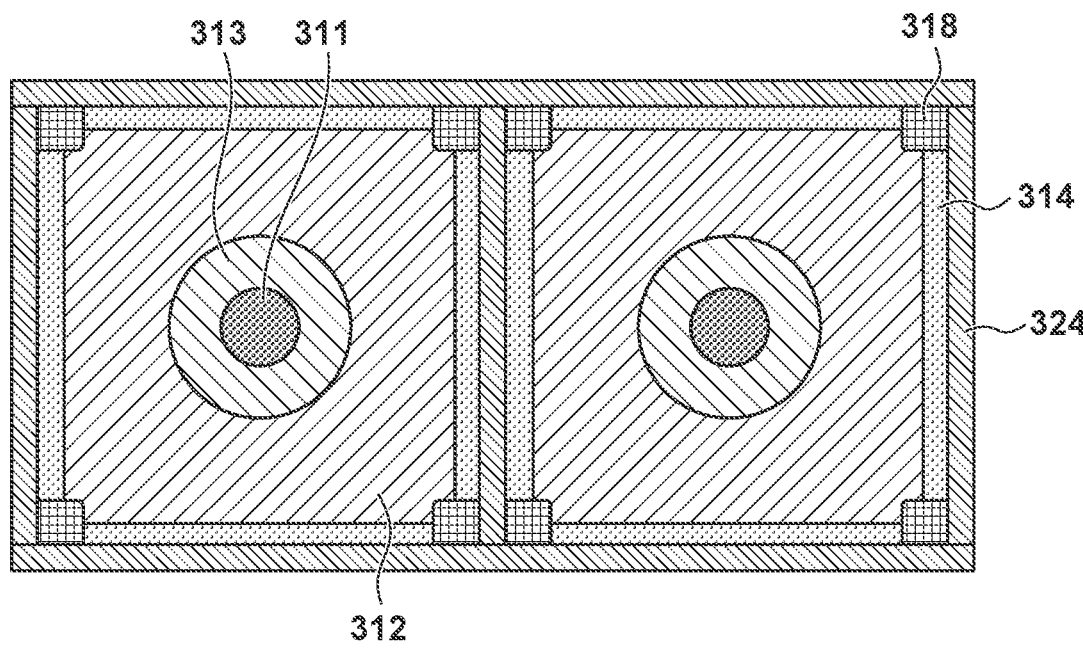
F I G. 6B
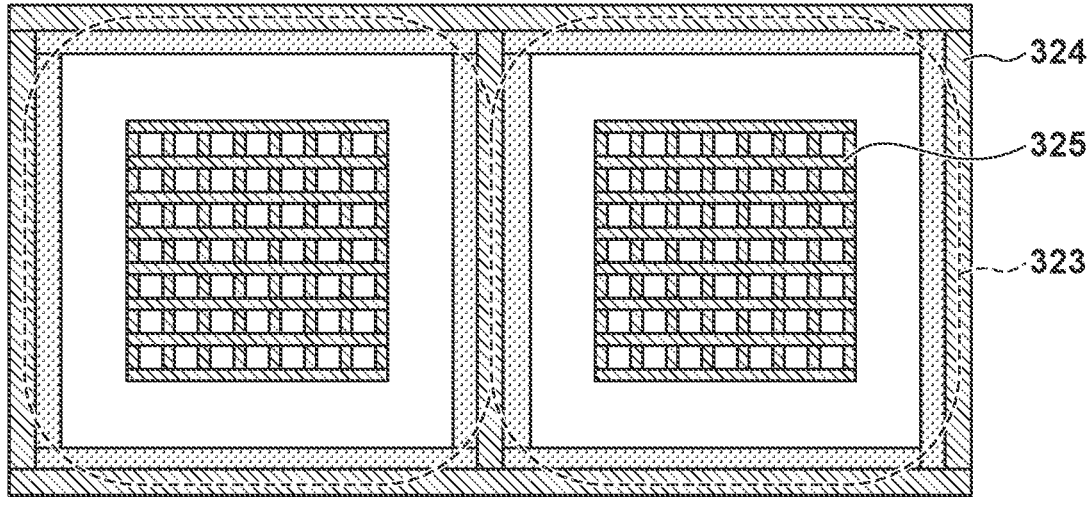

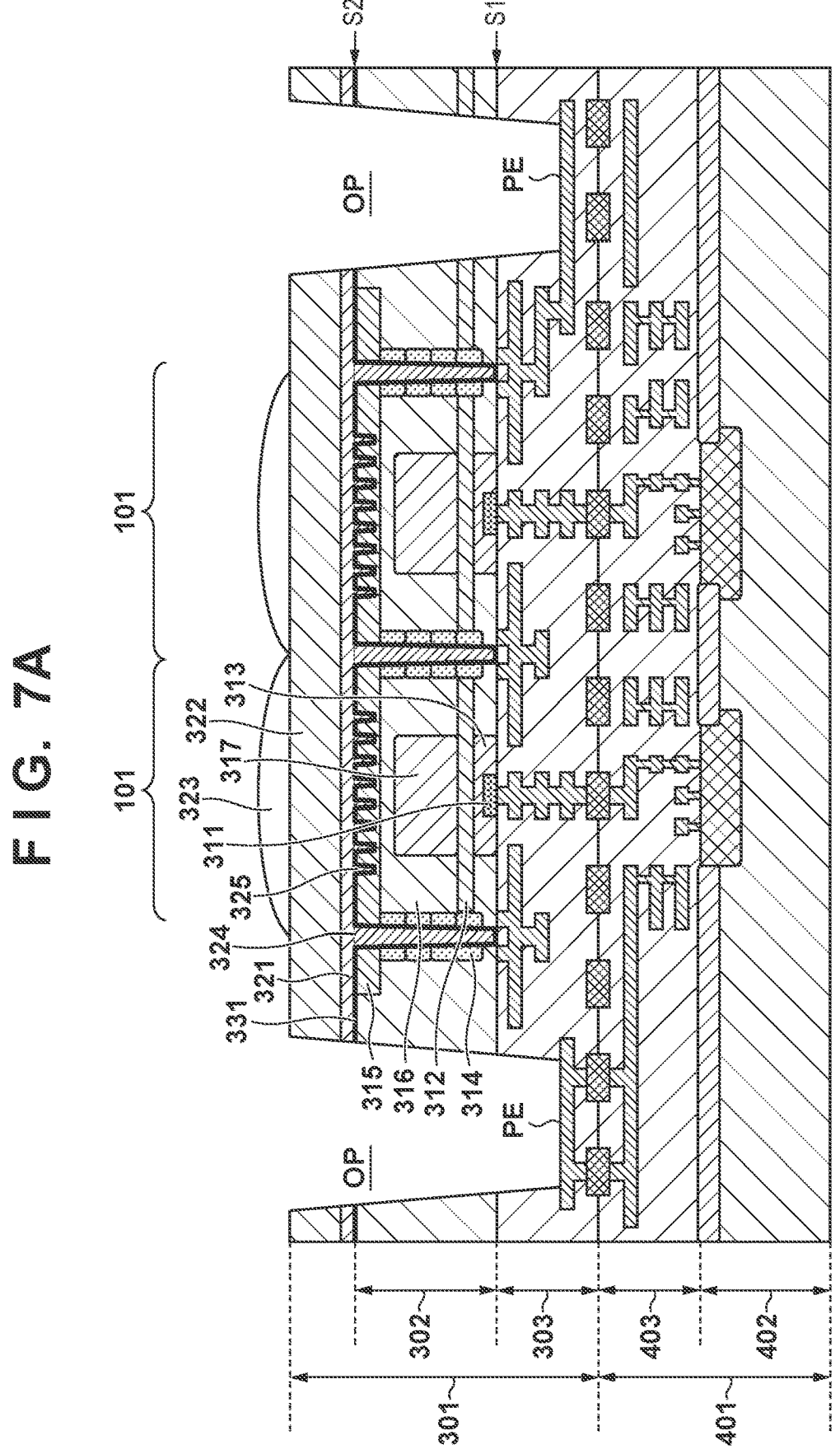
F I G. 7A

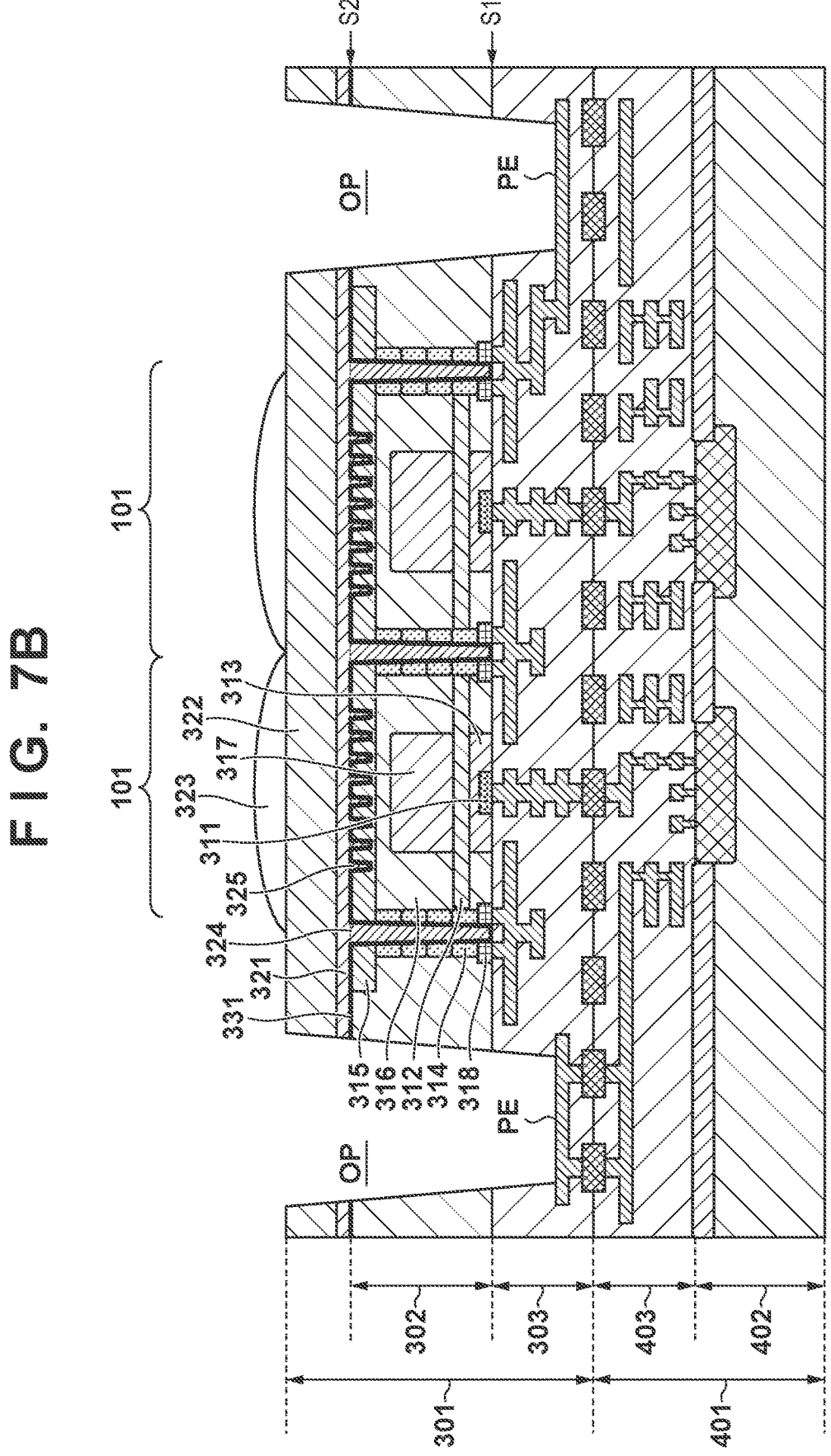
F I G. 7B

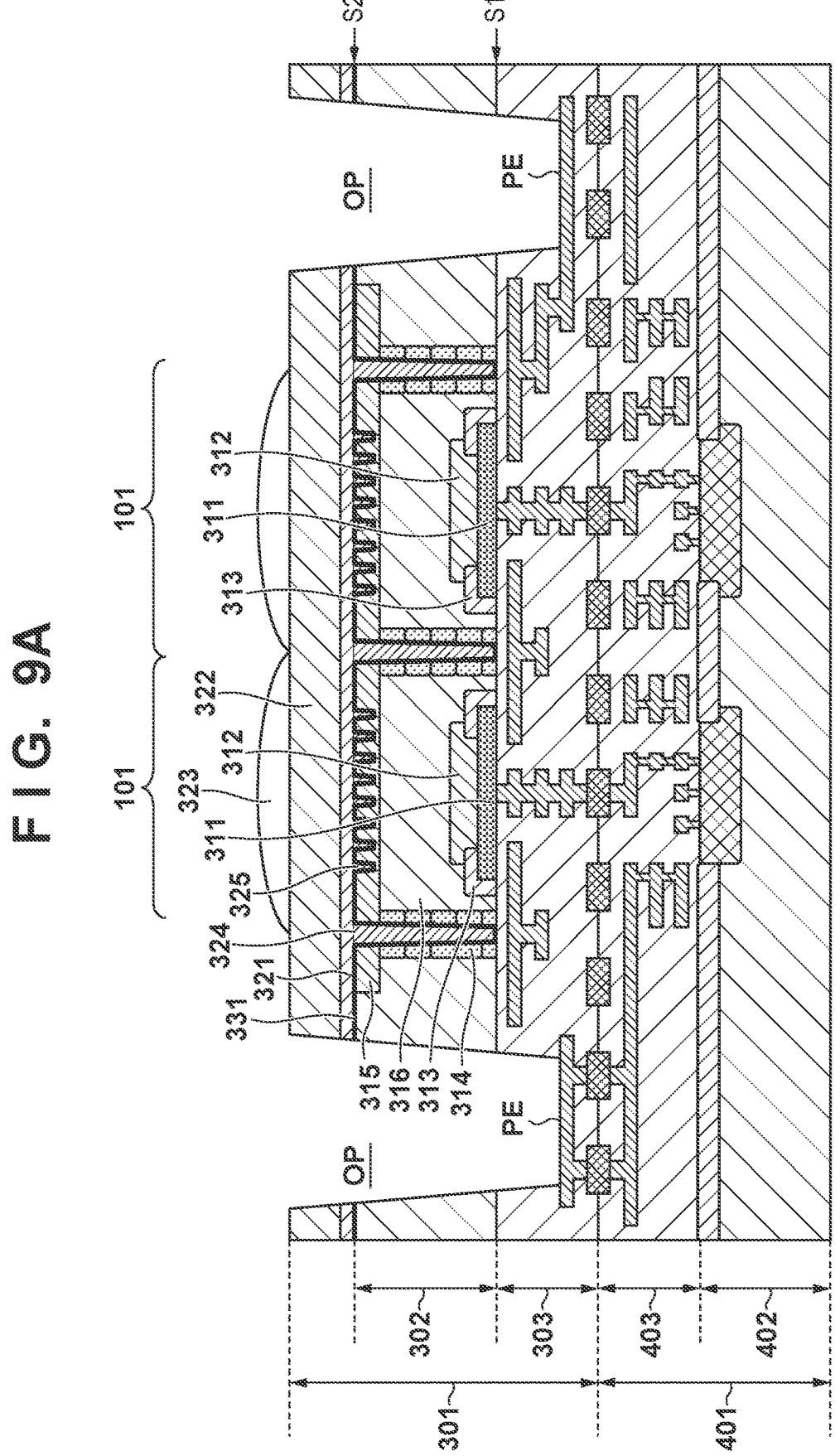
F I G. 9A

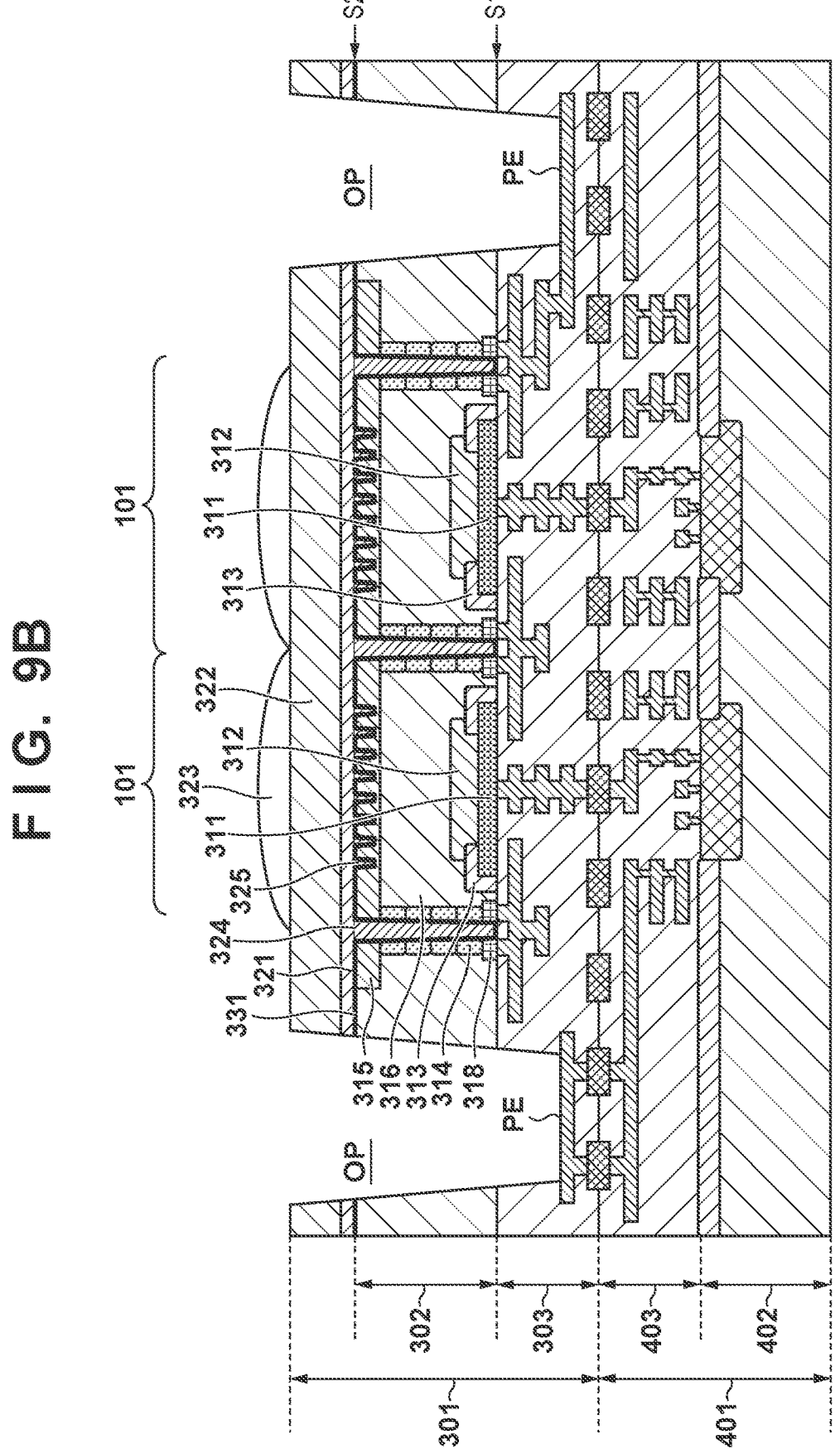
F I G. 9B

F I G. 12A
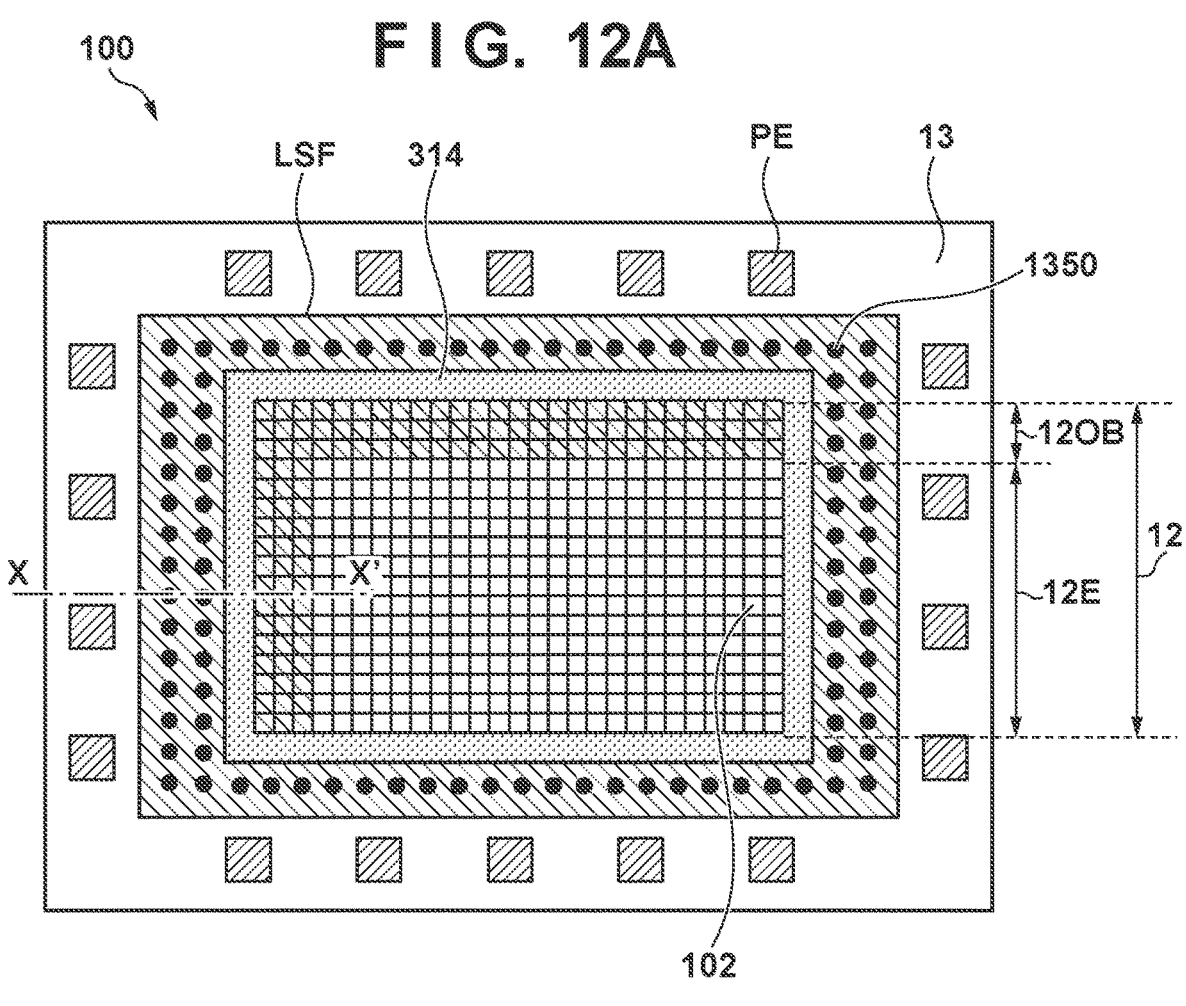
F I G. 12B
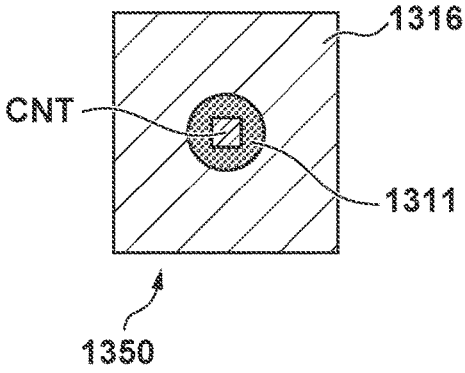

F I G. 14A
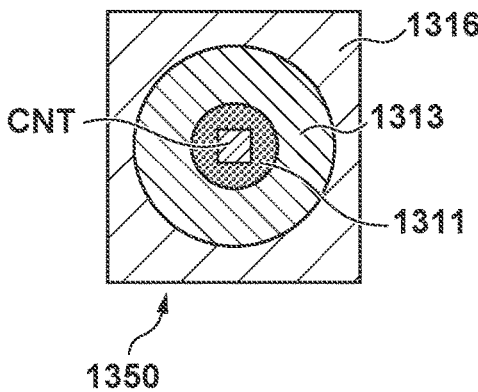
F I G. 14B

F I G. 15A
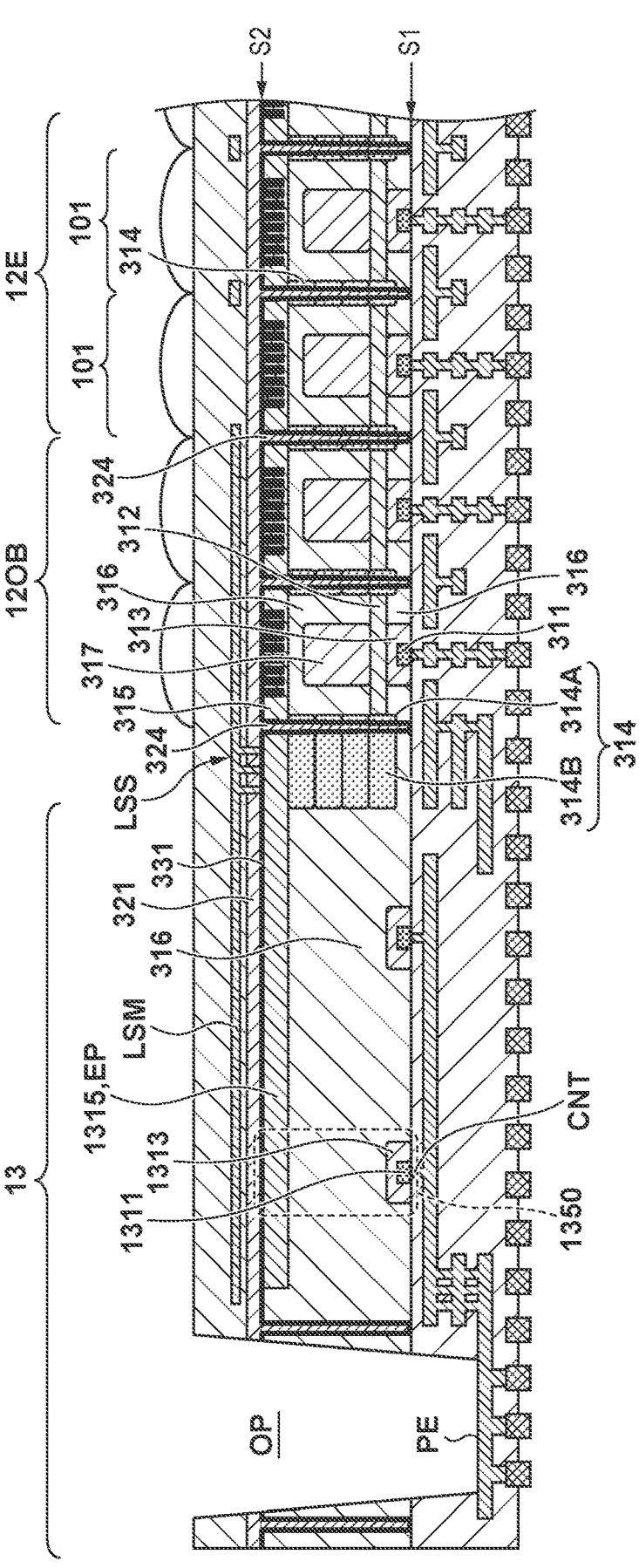

F I G. 15B
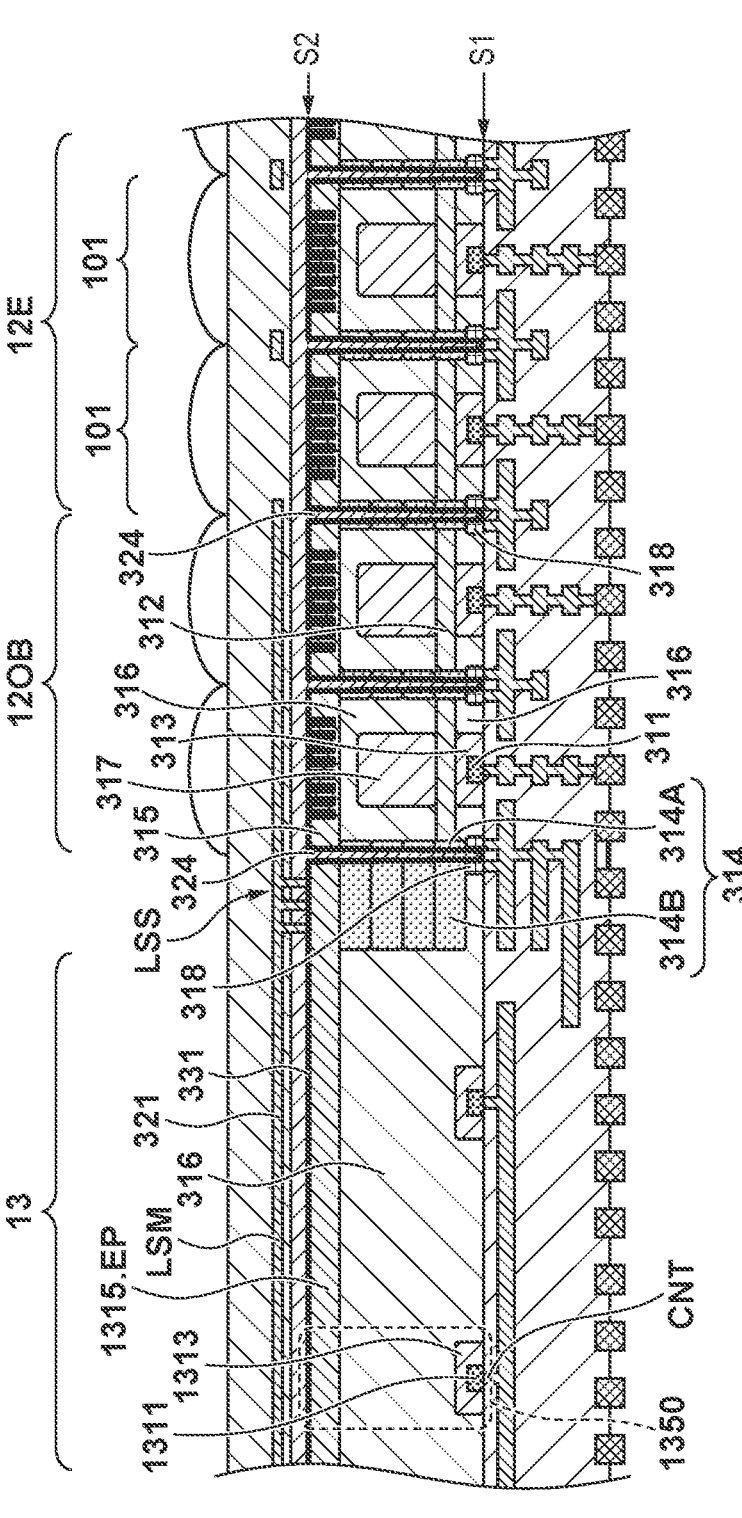

F I G. 16A
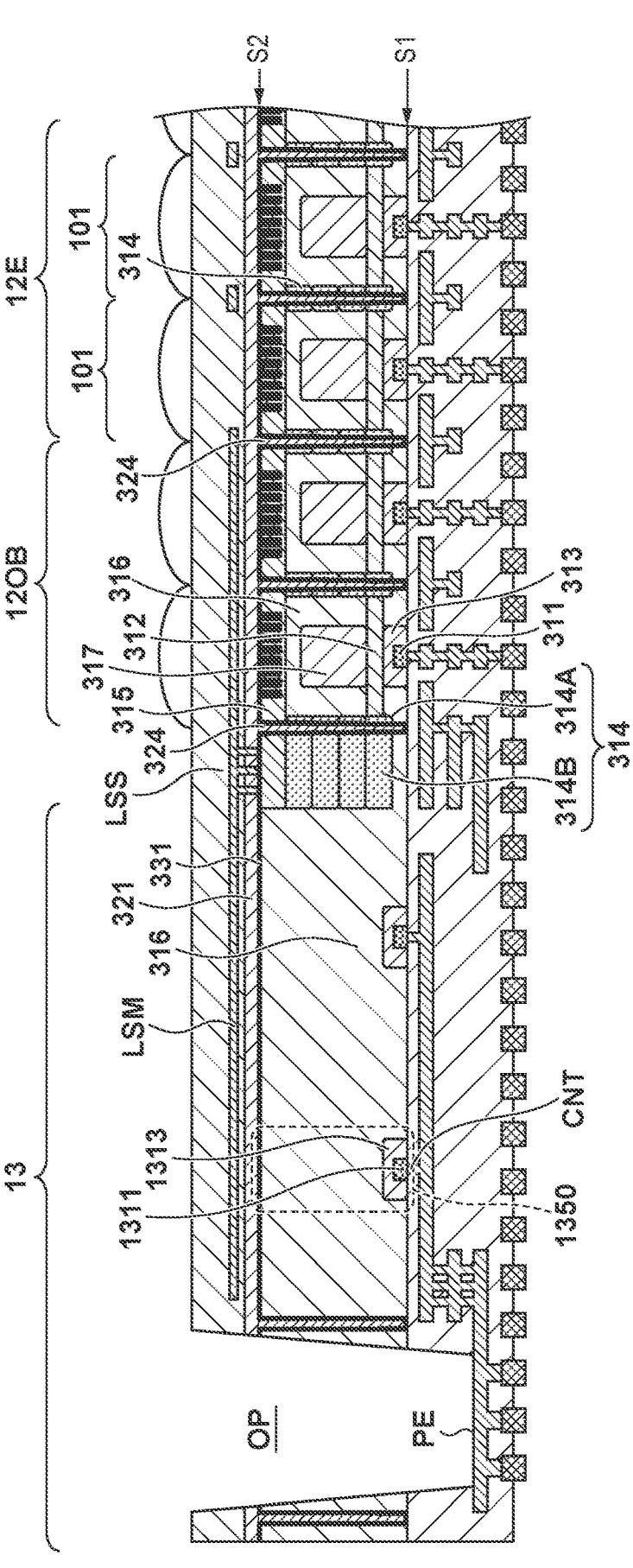

F I G. 17
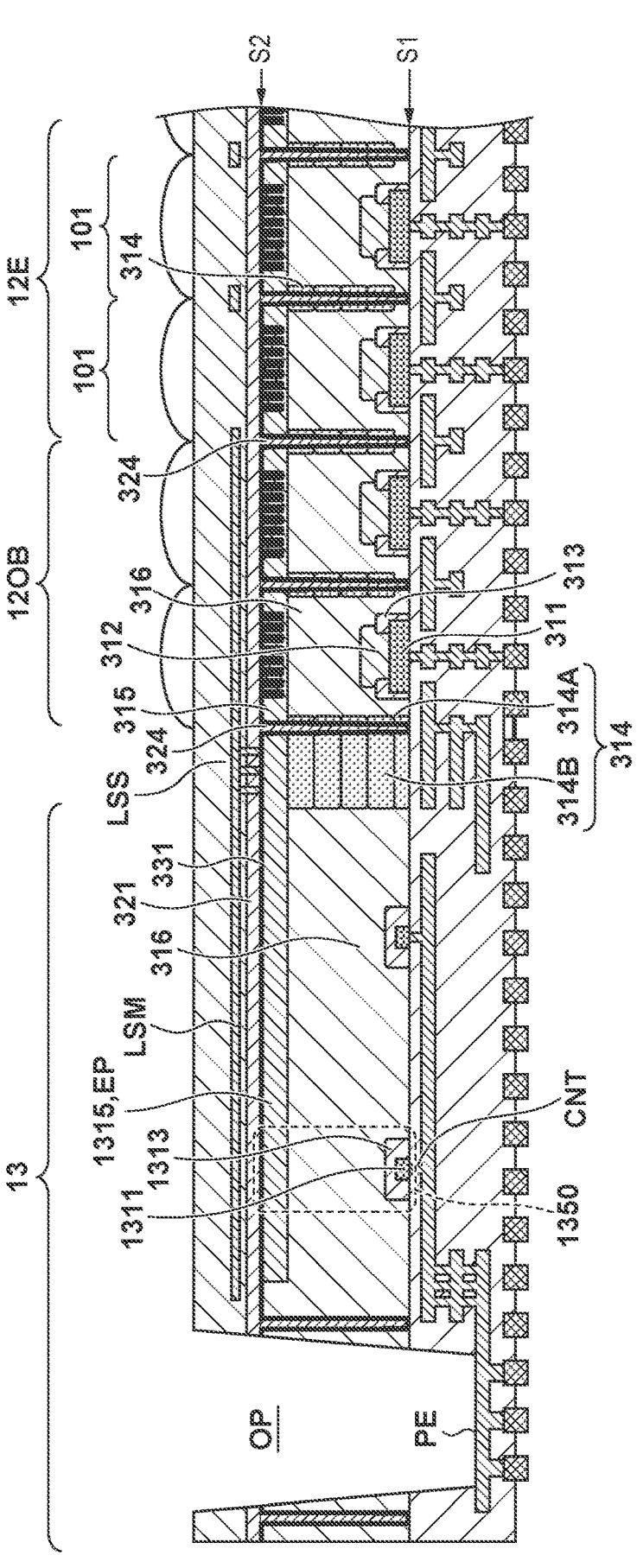

F I G. 18
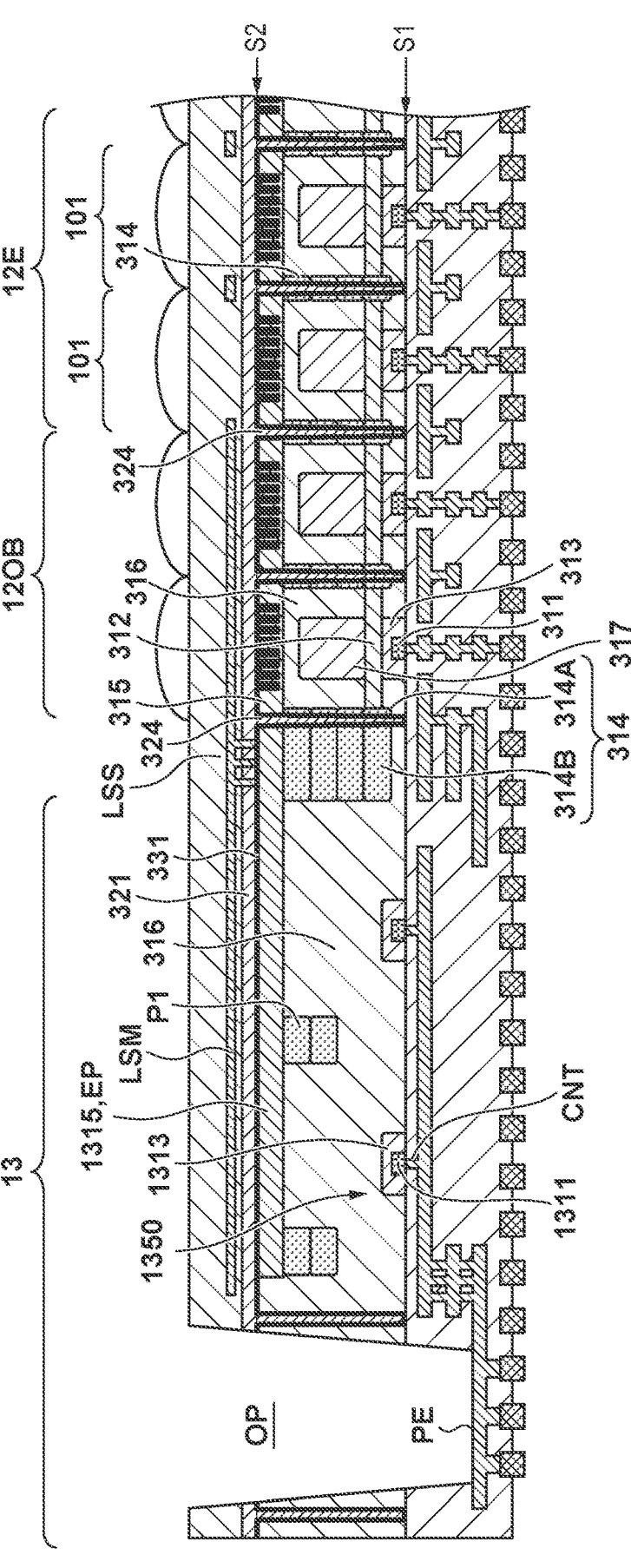

F I G. 19
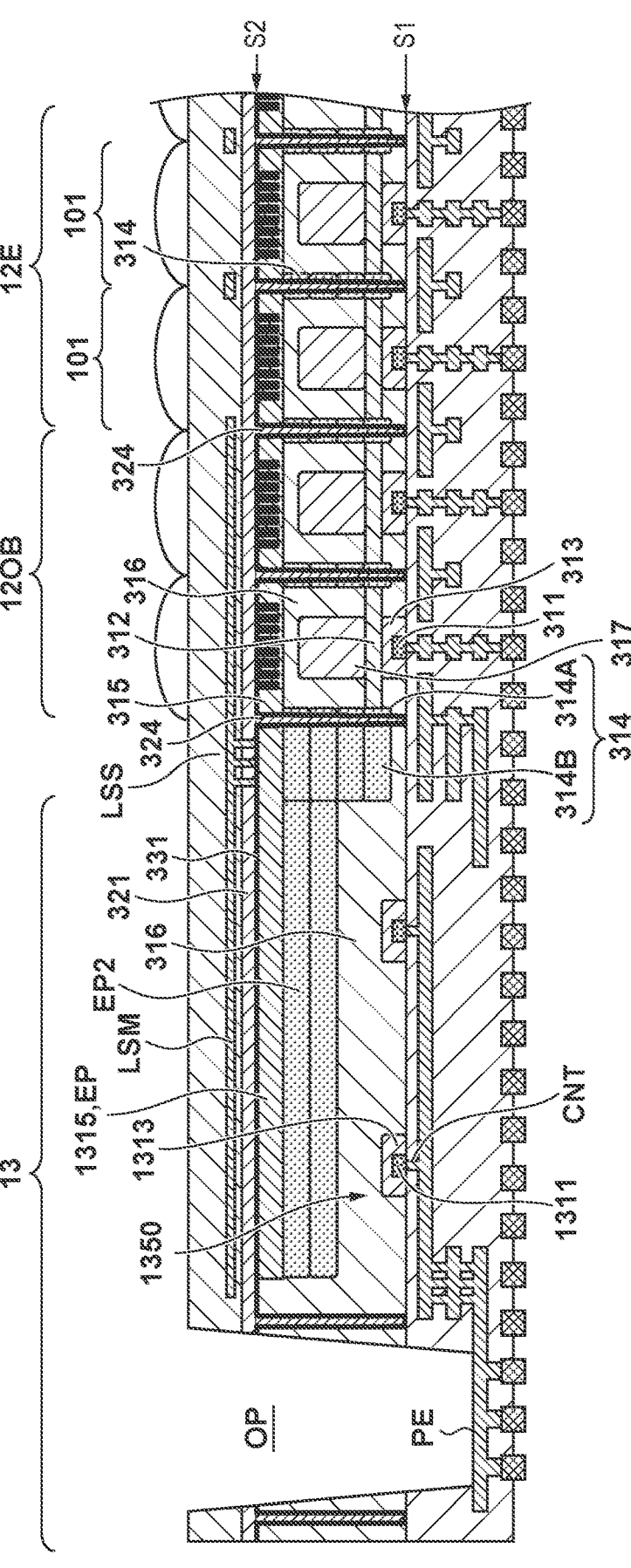

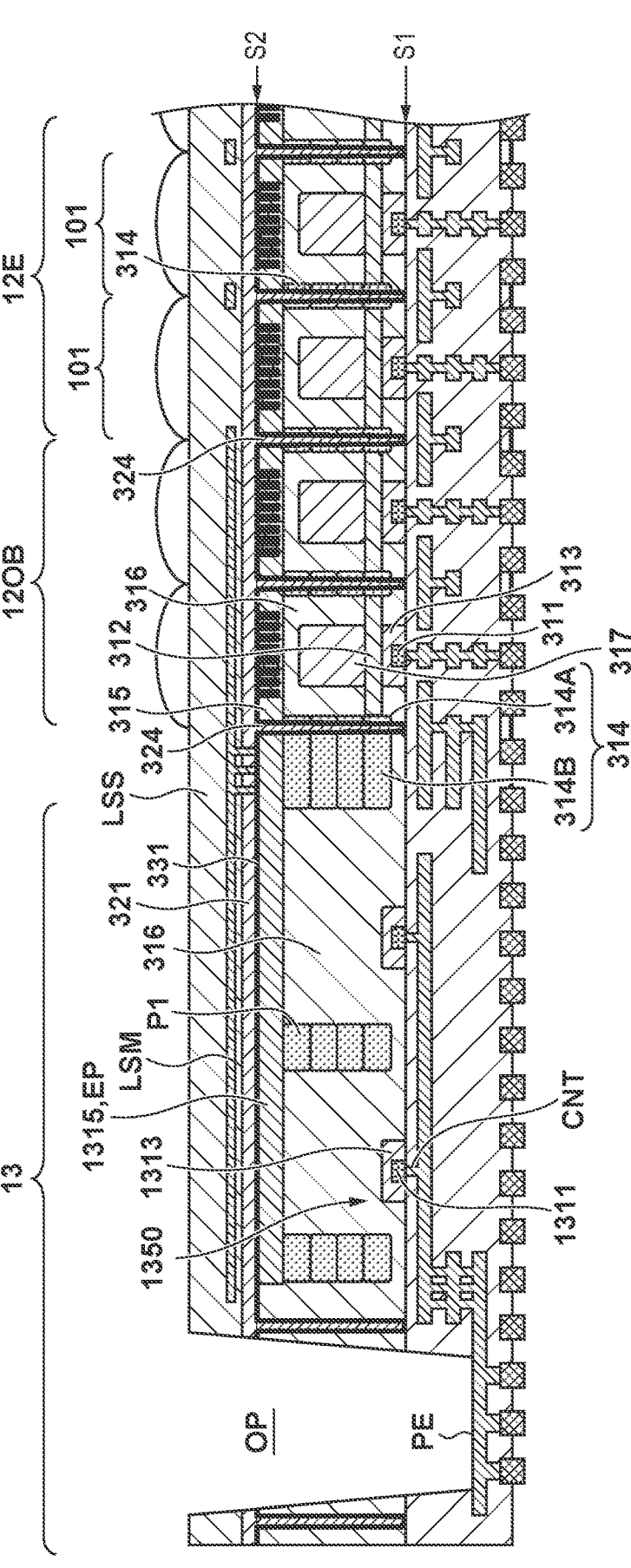
F I G. 21

F I G. 23
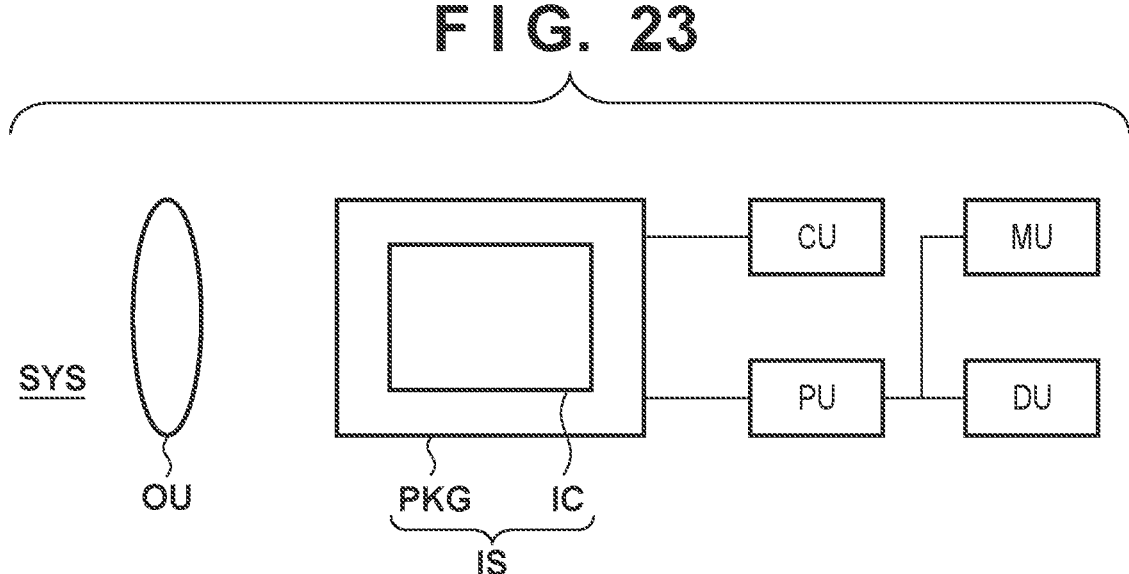

F I G. 25
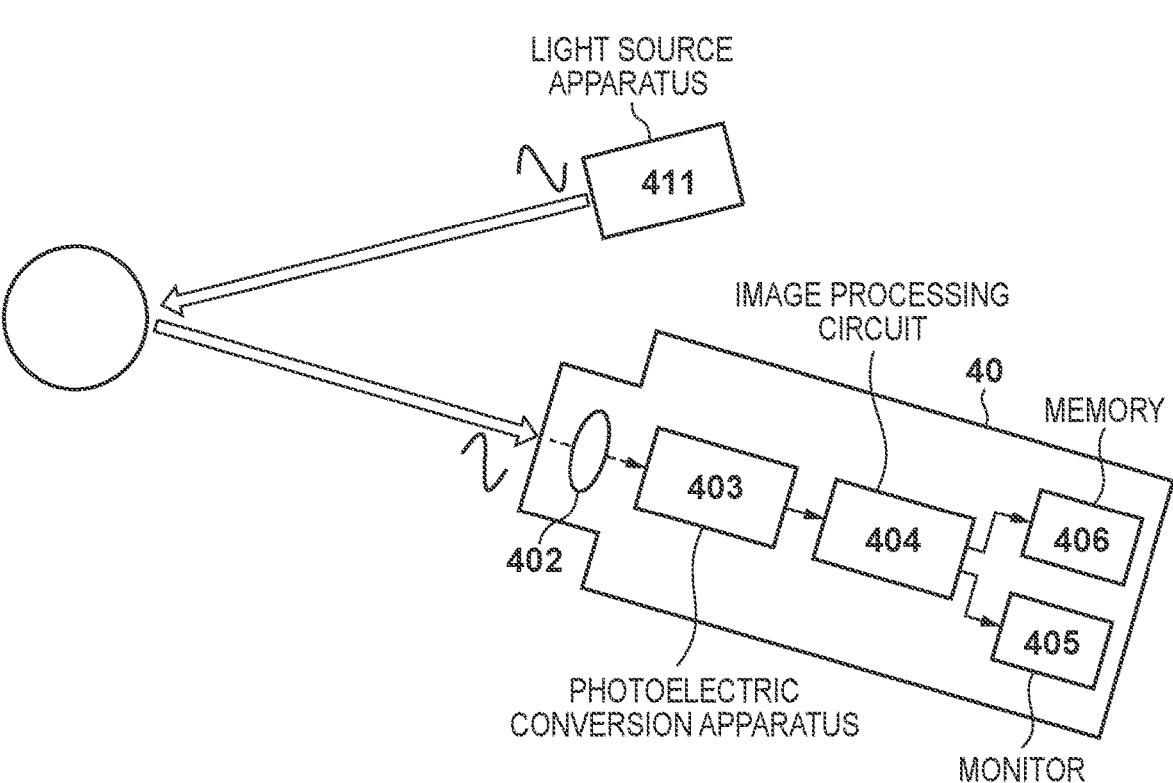

F I G. 27A
1600
1603
1601
1602
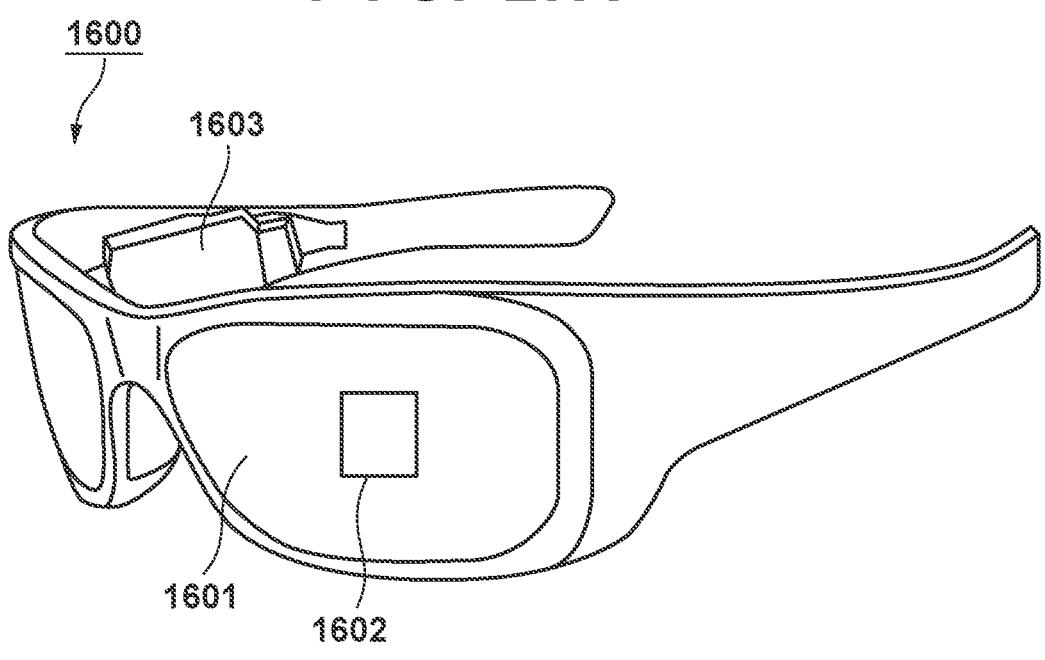
F I G. 27B
1610
1612
1611
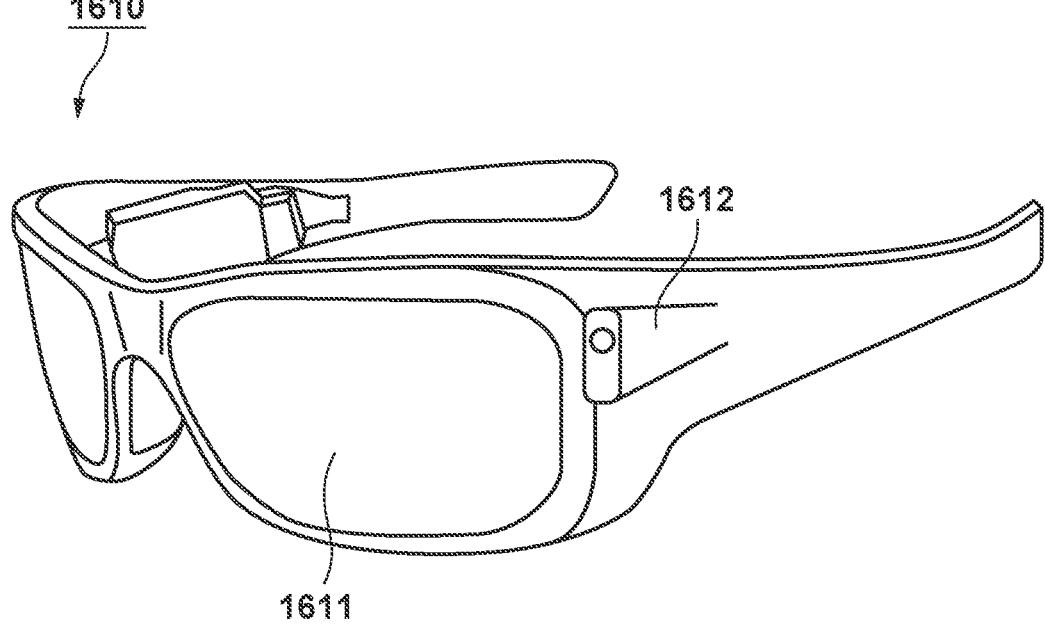

F I G. 28
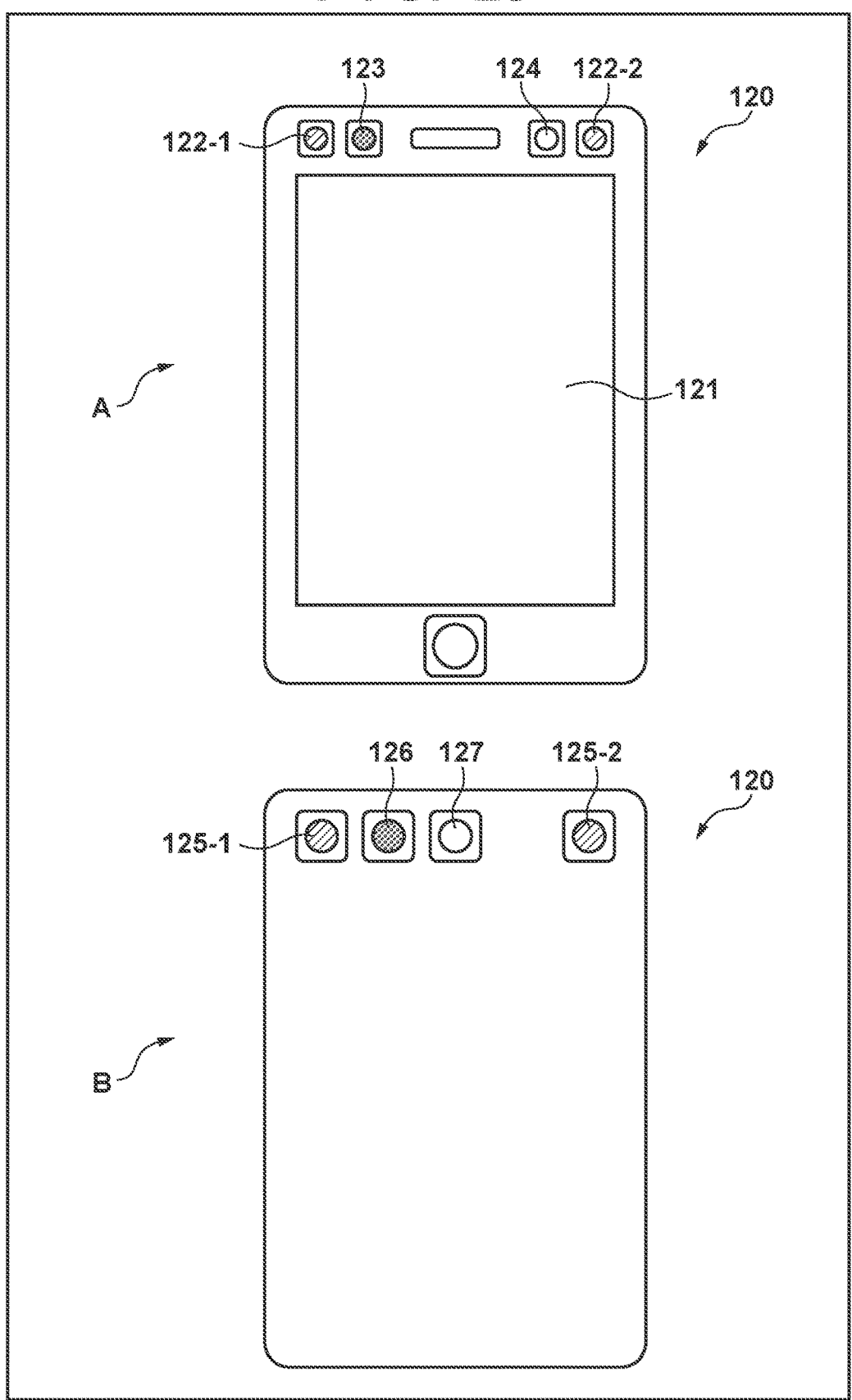

PHOTOELECTRIC CONVERSION APPARATUS AND PHOTOELECTRIC CONVERSION SYSTEM

BACKGROUND OF THE INVENTION

Field of the Invention

The present invention relates to a photoelectric conversion apparatus and a photoelectric conversion system.

Description of the Related Art

Japanese Patent Laid-Open No. 2018-201005 describes an Avalanche Photodiode (APD) for suppressing the Dark Count Rate (DCR) by reducing crosstalk from pixels. The APD includes a high electric field region, an isolation region for isolation from an adjacent pixel, and a hole accumulation region where electrons are trapped on the side wall of the isolation region, and has an arrangement in which the hole accumulation region is electrically connected to an anode.

A semiconductor substrate of a photoelectric conversion apparatus can include a pixel array region and a peripheral region arranged on the periphery of the pixel array region. If light unintentionally enters the peripheral region, charges (electrons and holes) are generated by photoelectric conversion, and may enter the pixels of the pixel array. Alternatively, if charges generated by photoelectric conversion are recombined to generate light, the light can be detected by the pixels of the pixel array, for example, light-shielded pixels (OB pixels).

SUMMARY OF THE INVENTION

The present invention provides a technique advantageous in reducing the influence of light entering the peripheral region of a photoelectric conversion apparatus.

A first aspect of the present invention provides a photoelectric conversion apparatus including a semiconductor layer that includes a pixel array region having a plurality of pixels, and a peripheral region arranged on a periphery of the pixel array region, wherein the semiconductor layer has a first face and a second face, each pixel of the pixel array region includes a first semiconductor region of a first conductivity type arranged on a side of the first face, and a second semiconductor region of a second conductivity type arranged on a side of the second face, and a predetermined voltage that can cause an avalanche multiplication operation is supplied between the first semiconductor region and the second semiconductor region, the peripheral region includes a third semiconductor region of the first conductivity type arranged on the side of the first face, a fourth semiconductor region of the second conductivity type arranged apart from the third semiconductor region, and a fifth semiconductor region of the first conductivity type arranged, close to the third semiconductor region, between the third semiconductor region and the fourth semiconductor region, and an impurity concentration of the first conductivity type in the fifth semiconductor region is lower than an impurity concentration of the first conductivity type in the third semiconductor region, a voltage is supplied between the third semiconductor region and the fourth semiconductor region.

A second aspect of the present invention provides a photoelectric conversion apparatus including a semiconductor layer that includes a pixel array region with a plurality of pixels and a peripheral region arranged on a periphery of the pixel array region, wherein the semiconductor layer has a first face and a second face, each pixel of the pixel array region includes a first semiconductor region of a first conductivity type arranged on a side of the first face, and a second semiconductor region of a second conductivity type arranged on a side of the second face, and a predetermined voltage that can cause an avalanche multiplication operation is supplied between the first semiconductor region and the second semiconductor region, and the peripheral region includes a third semiconductor region of the first conductivity type arranged on the side of the first face and a fourth semiconductor region of the second conductivity type arranged apart from the third semiconductor region, the fourth semiconductor region includes an extending portion extending in parallel to the second face, and a voltage is supplied between the third semiconductor region and the fourth semiconductor region.

Further features of the present invention will become apparent from the following description of exemplary embodiments with reference to the attached drawings.

BRIEF DESCRIPTION OF THE DRAWINGS

FIG. 1 is a view showing the basic arrangement of a photoelectric conversion apparatus according to an embodiment;

FIG. 2 is a view showing an example of the arrangement of a sensor substrate;

FIGS. 5A and 5B are views for explaining the operation of a pixel;

FIGS. 6A and 6B are views showing a first arrangement example of the pixel;

FIGS. 7A and 7B are views showing a first arrangement example of the pixel;

FIGS. 9A and 9B are views showing the second arrangement example of the pixel;

FIGS. 12A and 12B are plan views showing the arrangement of a photoelectric conversion apparatus according to a second embodiment;

FIGS. 14A and 14B are plan views showing the arrangement of a photoelectric conversion apparatus according to a third embodiment;

FIG. 15A is a sectional view showing the arrangement of the photoelectric conversion apparatus according to the third embodiment;

FIG. 15B is a sectional view showing the arrangement of the photoelectric conversion apparatus according to the third embodiment;

US 12,581,761 B2

3

Figure 16B:
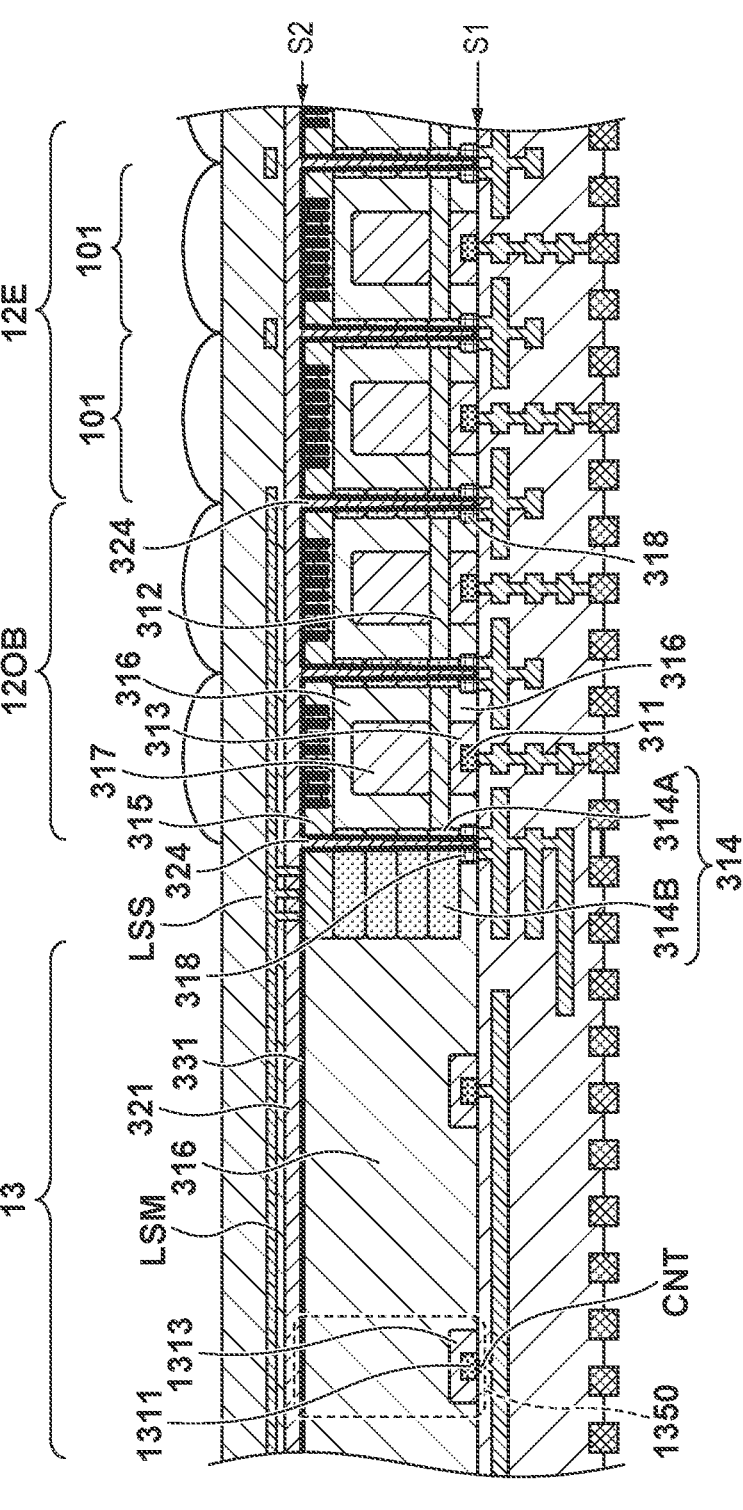
FIG. 16A is a sectional view showing the arrangement of a photoelectric conversion apparatus according to a fourth embodiment.
Figure 20:
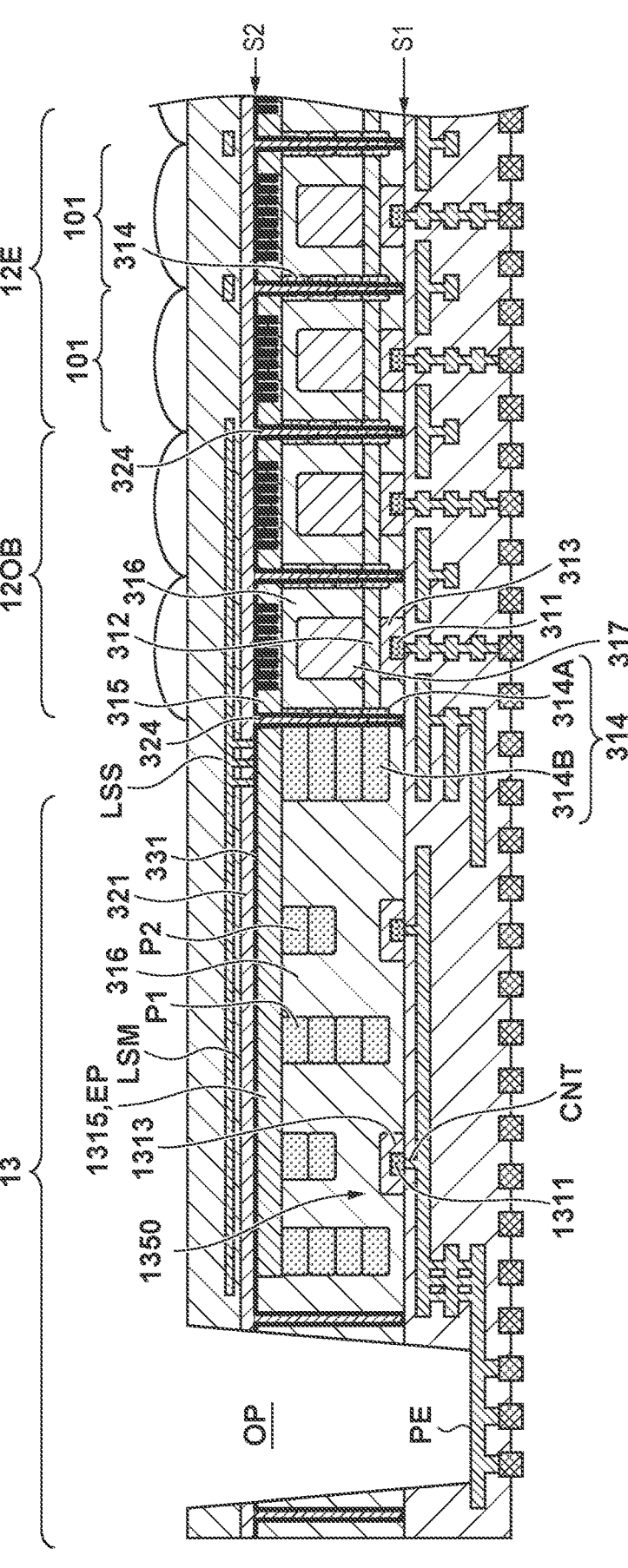
Figure 22:
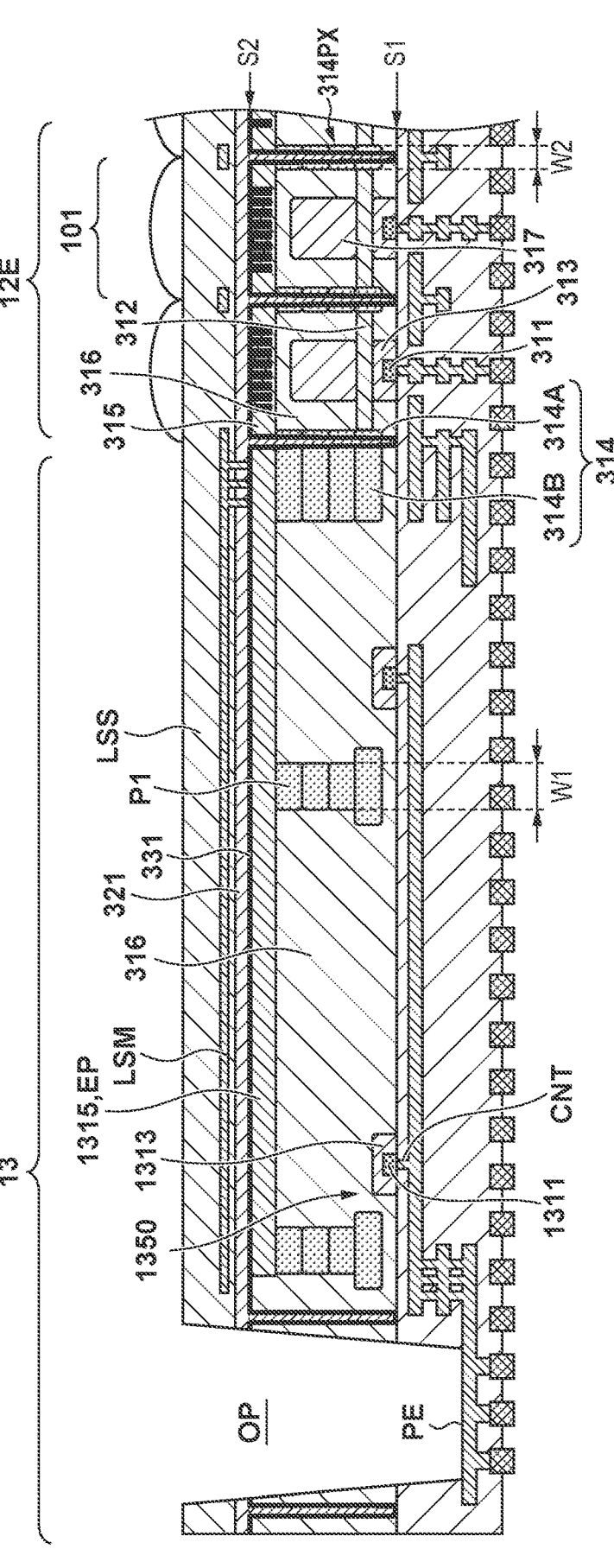
Figure 24A:
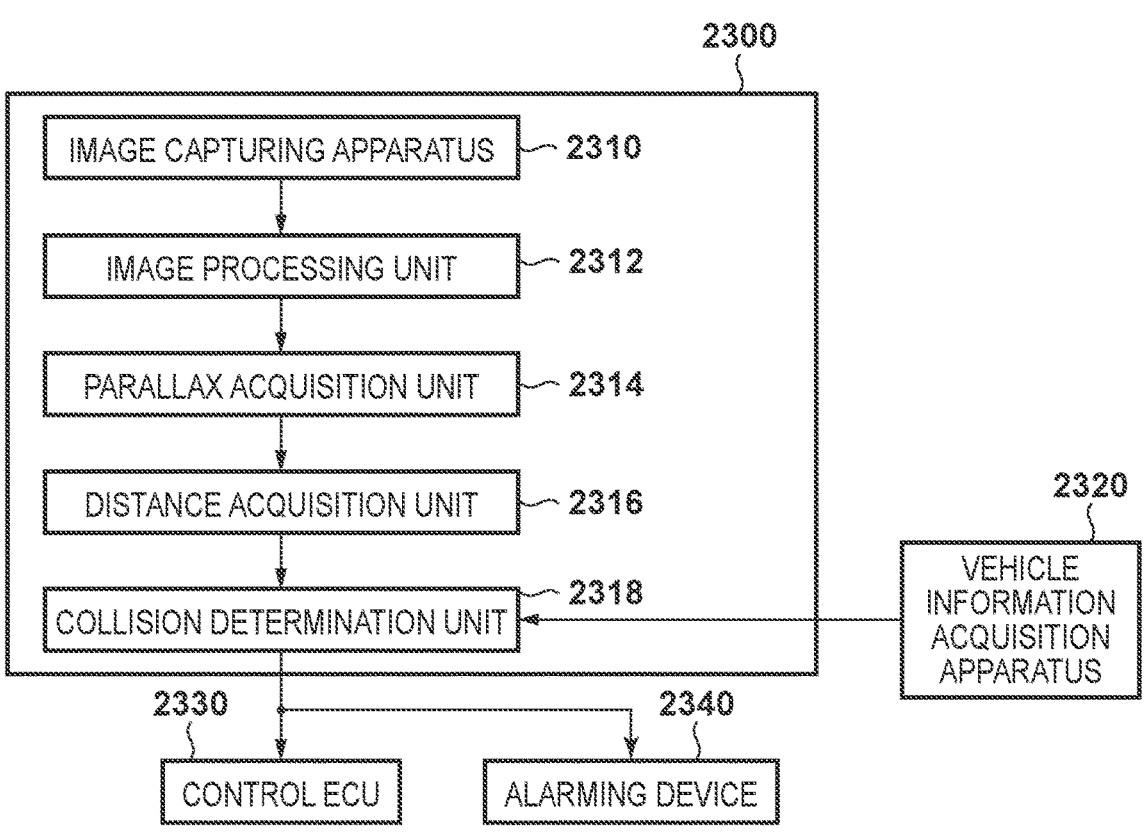
Figure 24B:
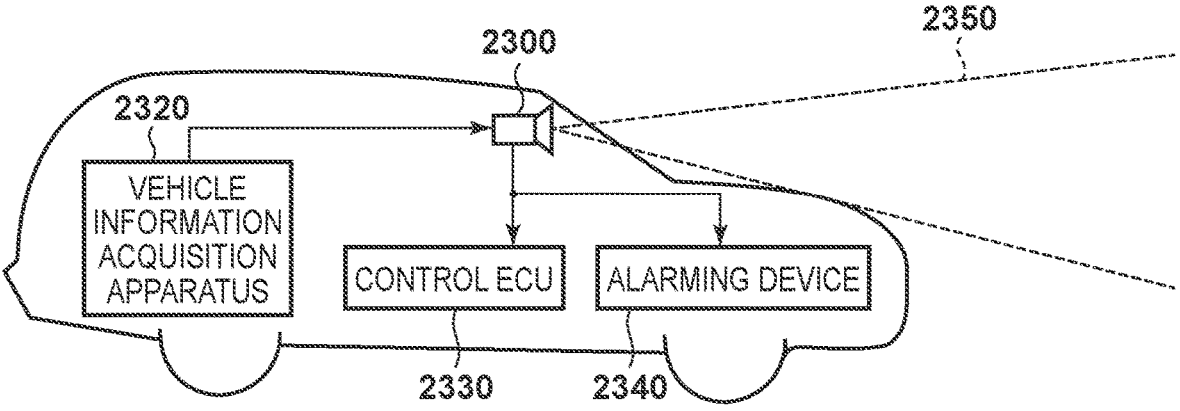
Figure 26:
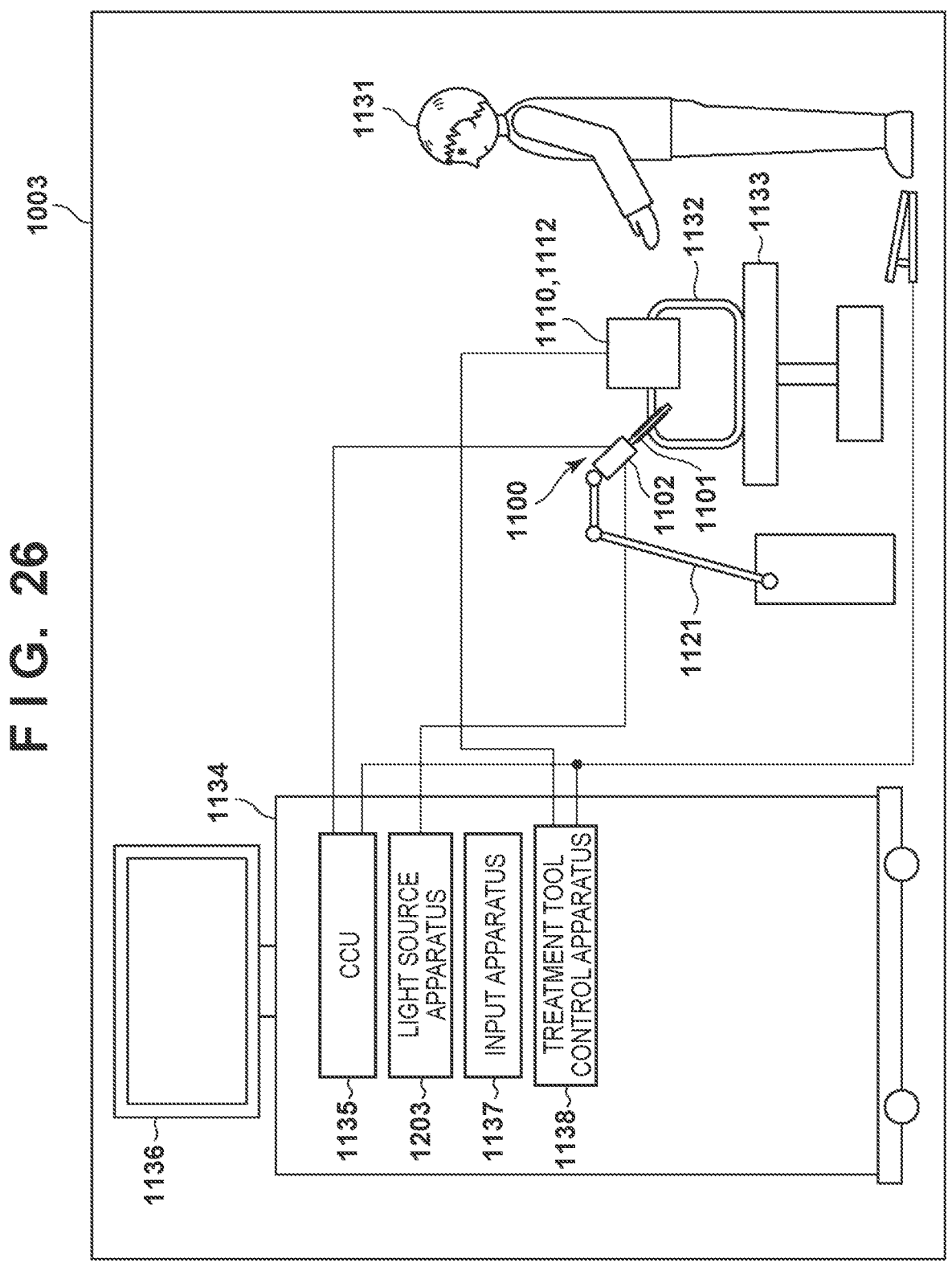

FIG. 16B is a sectional view showing the arrangement of the photoelectric conversion apparatus according to the fourth embodiment;

FIG. 17 is a sectional view showing the arrangement of a photoelectric conversion apparatus according to a fifth embodiment;

FIG. 18 is a sectional view showing the arrangement of a photoelectric conversion apparatus according to a sixth embodiment;

FIG. 19 is a sectional view showing the arrangement of a photoelectric conversion apparatus according to a seventh embodiment;

FIG. 20 is a sectional view showing the arrangement of a photoelectric conversion apparatus according to an eighth embodiment;

FIG. 21 is a sectional view showing the arrangement of a photoelectric conversion apparatus according to a ninth embodiment;

FIG. 22 is a sectional view showing the arrangement of a photoelectric conversion apparatus according to a 10th embodiment;

FIG. 23 is a view showing a configuration of a photoelectric conversion system;

FIGS. 24A and 24B are views showing a configuration of a photoelectric conversion system;

FIG. 25 is a view showing a configuration of a photoelectric conversion system;

FIG. 26 is a view showing a configuration of a photoelectric conversion system;

FIGS. 27A and 27B are views each showing a configuration of a photoelectric conversion system; and FIG. 28 is a view showing a configuration of a photoelectric conversion system.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Embodiments of the present invention will be described in detail below based on the accompanying drawings. Note that in the following description, terms (for example, "upper", "lower", "right", "left" and other terms including these terms) representing specific directions or positions are used, as necessary. These terms are used for easy understanding of the embodiments with reference to the accompanying drawings, and the meanings of the terms do not limit the technical scope of the present invention.

In this specification, a planar view corresponds to viewing from a direction perpendicular to the light incident surface of a semiconductor layer. A sectional view corresponds to a plane in the direction perpendicular to the light incident surface of the semiconductor layer. Note that if the light incident surface of the semiconductor layer is rough microscopically, the plan view is defined with reference to the light incident surface of the semiconductor layer when viewed macroscopically.

In the following description, the anode of an avalanche photodiode (APD) is set to a fixed potential, and a signal is extracted from the cathode side. Therefore, a semiconductor region of the first conductivity type containing, as a majority carrier, a charge with the same polarity as that of a signal charge is an n-type semiconductor region, and a semiconductor region of the second conductivity type containing, as a majority carrier, a charge with the polarity different from that of the signal charge is a p-type semiconductor region. Note that even if the cathode of the APD is set to a fixed potential and a signal is extracted from the anode side, the present invention is viable. In this case, a semiconductor region of the first conductivity type containing, as a majority carrier, a charge with the same polarity as that of a signal charge is a p-type semiconductor region, and a semiconductor region of the second conductivity type containing, as a majority carrier, a charge with the polarity different from that of the signal charge is an n-type semiconductor region. A case in which one node of the APD is set to a fixed potential will be described below but the potentials of both the nodes may be variable.

In this specification, if a term "impurity concentration" is simply used, this indicates a net impurity concentration obtained by subtracting an impurity concentration compensated by impurities of an opposite conductivity type. That is, the "impurity concentration" indicates a net doping concentration. A region where the concentration of the added p-type impurities is higher than the concentration of the added n-type impurities is a p-type semiconductor region. To the contrary, a region where the concentration of the added n-type impurities is higher than the concentration of the added p-type impurities is an n-type semiconductor region.

The basic arrangement and driving method common to photoelectric conversion apparatuses and driving methods therefor according to a plurality of embodiments to be described later will first be described with reference to FIGS. 1, 2, 3, 4, 5A, and 5B.

FIG. 1 is a view showing the basic arrangement of a photoelectric conversion apparatus 100 according to an embodiment. An example in which the photoelectric conversion apparatus 100 is formed as a stacked photoelectric conversion apparatus will be described but the present invention is applicable to photoelectric conversion apparatuses other than the stacked photoelectric conversion apparatus. The photoelectric conversion apparatus 100 can be formed by stacking a plurality of substrates including a sensor substrate 301 and a circuit substrate 401, and electrically connecting the plurality of substrates. The sensor substrate 301 can include a first semiconductor layer including photoelectric converters 102 (to be described later), and a first wiring structure. The circuit substrate 401 can include a second semiconductor layer including a circuit such as signal processing units 103 (to be described later), and a second wiring structure. The photoelectric conversion apparatus 100 can be formed by stacking, for example, the second semiconductor layer, the second wiring structure, the first wiring structure, and the first semiconductor layer in this order. The photoelectric conversion apparatus to be described in each of the following embodiments can be, for example, a back-side illumination photoelectric conversion apparatus but the photoelectric conversion apparatus according to the present invention may be formed as a front-side illumination photoelectric conversion apparatus.

Each of the sensor substrate 301 and the circuit substrate 401 can be a chip diced from a wafer, but is not limited to the chip. For example, each substrate may be a wafer. The plurality of substrates may be obtained by stacking wafers and dicing them, or by forming chips and stacking or bonding the plurality of chips.

The sensor substrate 301 can include a semiconductor layer including a pixel array region 12 including a plurality of pixels, and a peripheral region 13 arranged on the periphery of the pixel array region 12. A region between the outer edge of the pixel array region 12 and the outer edge of the sensor substrate 301 can be the peripheral region 13. In the peripheral region 13, circuit elements such as active elements may or may not be arranged. The circuit substrate 401 can include a semiconductor layer including a circuit region 22 where a signal detected by a pixel of the pixel array region 12 is processed.

FIG. 2 is a view showing an example of the arrangement of the sensor substrate 301. In the pixel array region 12, a plurality of pixels 101 can be arranged in a two-dimensional array to form a plurality of rows and a plurality of columns. Each pixel 101 can include a photoelectric converter 102 including an avalanche photodiode (to be referred to as an APD hereinafter).

Each pixel 101 arranged in the pixel array region 12 can be a pixel for forming an image. However, if the sensor substrate 301 or the photoelectric conversion apparatus 100 is applied to Time of Flight (TOF), each pixel 101 need not always be a pixel for forming an image. That is, each pixel 101 may be a pixel for measuring the time at which light reaches and the amount of light.

Figures 3, 4:
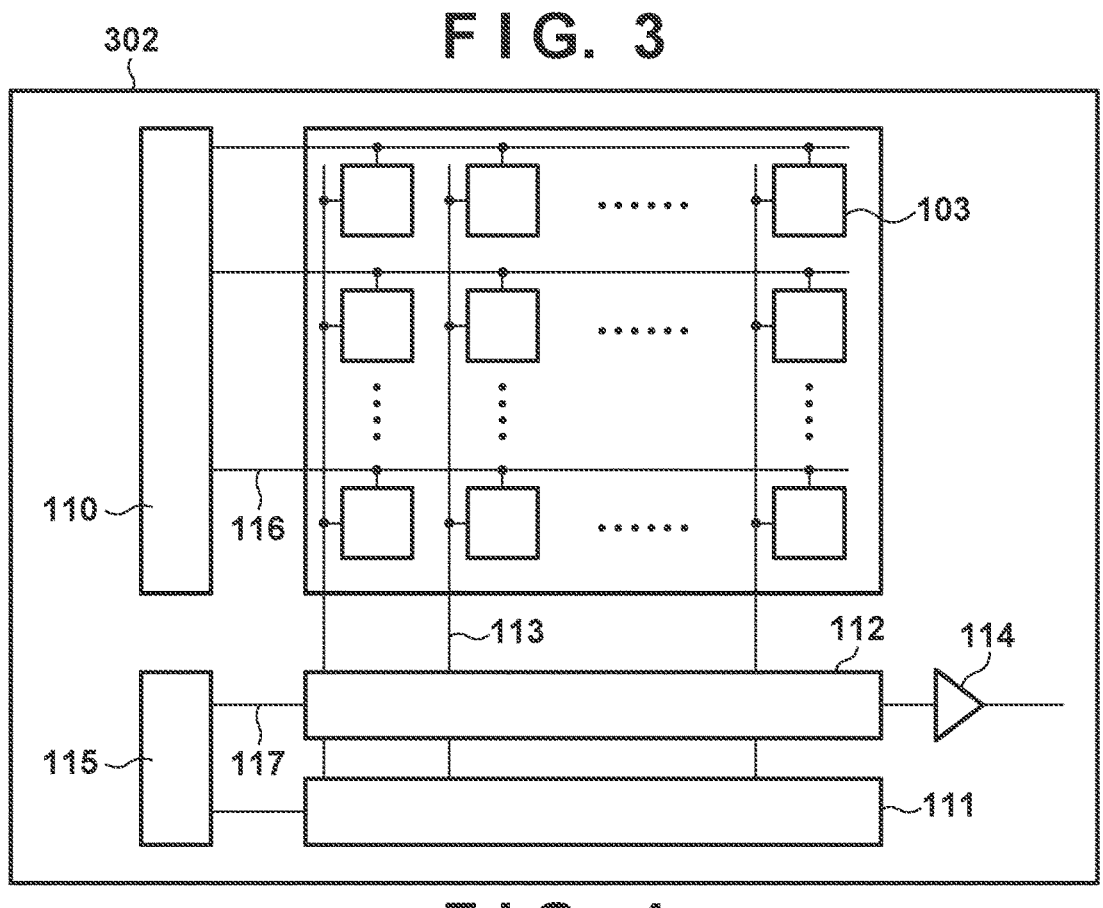
FIG. 3 is a view showing an example of the arrangement of a circuit substrate.
FIG. 4 is an equivalent circuit diagram of one pixel and a signal processing unit.

FIG. 3 is a view showing the arrangement of the circuit substrate 401. The circuit substrate 401 can include, for example, the signal processing units 103 each configured to process a charge generated by photoelectric conversion in the photoelectric converter 102, a readout circuit 112, a control pulse generation unit 115, a horizontal scanning circuit unit 111, signal lines 113, and a vertical scanning circuit unit 110. One signal processing unit 103 is provided for one pixel 101. Each photoelectric converter 102 shown in FIG. 2 and each signal processing unit 103 shown in FIG. 3 can electrically be connected via a connected wiring provided for each pixel 101.

For example, the vertical scanning circuit unit 110 can be configured to generate a second control pulse by receiving a first control pulse supplied from the control pulse generation unit 115, and supply the second control pulse to each pixel 101. The vertical scanning circuit unit 110 can include, for example, a logical circuit such as a shift register and an address decoder. A signal output from the photoelectric converter 102 of each pixel 101 can be processed by the signal processing unit 103 provided in correspondence with the pixel 101. The signal processing unit 103 can include a counter and a memory, and the memory can hold a digital value.

The horizontal scanning circuit unit 111 can be configured to supply, to the signal processing unit 103, a third control pulse for sequentially selecting columns to read out a digital signal from the memory of each pixel 101 that holds the signal. The circuit substrate 401 can include the plurality of signal lines 113. Signals are output, to the plurality of signal lines 113, from the signal processing units 103 assigned to the pixels 101 of the row selected by the vertical scanning circuit unit 110. The signals output to the plurality of signal lines 113 can be output, via an output circuit 114, to a recording unit or a signal processing unit outside the photoelectric conversion apparatus 100.

Referring to FIG. 2, the array of the photoelectric converters 102 or the pixels 101 in the pixel array region 12 may be a one-dimensional array. Each signal processing unit 103 may be assigned to at least two photoelectric converters 102 or pixels 101.

As shown in FIGS. 2 and 3, the plurality of signal processing units 103 can be arranged in a region overlapping the pixel array region 12 in a planar view. Then, the vertical scanning circuit unit 110, the horizontal scanning circuit unit 111, the readout circuit 112, the output circuit 114, and the control pulse generation unit 115 can be arranged to overlap the region between the outer edge of the sensor substrate 301 and the outer edge of the pixel array region 12 in a planar view. In other words, the vertical scanning circuit unit 110, the horizontal scanning circuit unit 111, the readout circuit 112, the output circuit 114, and the control pulse generation unit 115 can be arranged in a region overlapping the peripheral region 13 of the sensor substrate 301 in a planar view.

FIG. 4 exemplifies an equivalent circuit of one pixel 101 in FIG. 2 and one signal processing unit 103 in FIG. 3. An APD 201 generates charge pairs corresponding to incident light by photoelectric conversion. The anode of the APD 201 is supplied with a voltage VL (first voltage). The cathode of the APD 201 can be supplied with a voltage VH (second voltage) higher than the voltage VL supplied to the anode. A reverse bias voltage (predetermined voltage) that can cause the APD 201 to perform an avalanche multiplication operation can be supplied between the anode and the cathode. By setting the state in which such reverse bias voltage is supplied between the anode and the cathode, charges generated by the incident light cause an avalanche multiplication operation, thereby generating an avalanche current.

A mode of operating an APD in a state in which the voltage between the anode and the cathode is higher than the breakdown voltage is called a Geiger mode. A mode of operating an APD in a state in which the voltage between the anode and the cathode is around or lower than the breakdown voltage is called a linear mode. An APD operated in the Geiger mode is called an SPAD. For example, the voltage VL (first voltage) is −30 V and the voltage VH (second voltage) is 1 V. The APD 201 may be operated in either the linear mode or the Geiger mode.

A quenching element 202 can be arranged to connect the APD 201 and a power supply for supplying the voltage VH. The quenching element 202 functions as a load circuit (quenching circuit) at the time of signal multiplication by an avalanche multiplication operation, and serves to suppress avalanche multiplication by suppressing the voltage supplied to the APD 201 (quenching operation). In addition, the quenching element 202 serves to return, to the voltage VH, the voltage supplied to the APD 201 by sending a current corresponding to a voltage drop caused by a quenching operation (recharging operation).

The signal processing unit 103 can include a waveform shaping unit 210, a counter circuit 211, and a selection circuit 212. The signal processing unit 103 may be a circuit including at least one of the waveform shaping unit 210, the counter circuit 211, and the selection circuit 212. The waveform shaping unit 210 can output a pulse signal by shaping the potential change of the cathode of the APD 201 obtained at the time of detection of a photon. As the waveform shaping unit 210, for example, an inverter circuit can be used. In FIG. 4, the waveform shaping unit 210 can be formed by one inverter but the waveform shaping unit 210 may include a plurality of serially connected inverters or include another circuit having the waveform shaping effect.

The counter circuit 211 can count a pulse signal output from the waveform shaping unit 210, and hold a count value. The counter circuit 211 can be configured to reset the signal held in the counter circuit 211 when a control pulse pRES is supplied via a driving line 213. The selection circuit 212 can be supplied with a control pulse pSEL from the vertical scanning circuit unit 110 in FIG. 3 via a driving line 214 (not shown in FIG. 3) in FIG. 4, thereby switching between electrical connection and non-connection of the counter circuit 211 and the signal line 113. The selection circuit 212 can include, for example, a buffer circuit for outputting a signal.

A switch such as a transistor may be arranged between the quenching element 202 and the APD 201 and/or between the photoelectric converter 102 and the signal processing unit 103, thereby controlling electrical connection by the switch. Similarly, a switch such as a transistor may control supply of the voltage VH and/or the voltage VL to the photoelectric converter 102.

The photoelectric conversion apparatus 100 may be configured to acquire a pulse detection timing using a Time-to-Digital Converter (to be referred to as a TDC hereinafter) and a memory, instead of the counter circuit 211. The generation timing of the pulse signal output from the waveform shaping unit 210 can be converted into a digital signal by the TDC. A control pulse pREF (reference signal) can be supplied from the vertical scanning circuit unit 110 in FIG. 1 to the TDC via a driving line to measure the timing of the pulse signal. The TDC can acquire, as a digital signal, a signal obtained when the input timing of the signal output from each pixel via the waveform shaping unit 210 is set as the relative time with reference to the control pulse pREF.

FIGS. 5A and 5B are views schematically showing the relationship between the operation of the APD 201 and the output signal. FIG. 5A is a view showing the APD 201, the quenching element 202, and the waveform shaping unit 210 shown in FIG. 4. The input side of the waveform shaping unit 210 is indicated by node A and the output side of the waveform shaping unit 210 is indicated by node B. FIG. 5B shows the waveform change of node A in FIG. 5A, and FIG. 5C shows the waveform change of node B in FIG. 5A.

During a period from time t0 to time t1, a potential difference of VH−VL is applied to the APD 201 shown in FIG. 5A. When a photon enters the APD 201 at time t1, the APD 201 performs an avalanche multiplication operation, and an avalanche multiplication current flows through the quenching element 202, thereby dropping the voltage of node A. If the voltage drop amount becomes larger and the potential difference applied to the APD 201 becomes smaller, the avalanche multiplication operation of the APD 201 stops at time t2, and the voltage level of node A does not drop to a value less than a given value. After that, a current that compensates for the voltage drop from the voltage VL flows through node A during a period from time t2 to time t3, and node A is stabilized at the original potential level at time t3. At this time, a portion of the output waveform of node A, which exceeds a given threshold, is shaped by the waveform shaping unit 210, and output as a signal from node B.

Note that the arrangement of the signal lines 113 and the arrangement of the readout circuit 112 and the output circuit 114 are not limited to those shown in FIG. 3. For example, the signal lines 113 may be extended in the row direction, and the readout circuit 112 may be arranged at a position to which the signal lines 113 are extended.

The first arrangement example of the pixels 101 will now be described with reference to FIGS. 6A, 6B, 7A, and 7B. Note that for the sake of convenience, FIGS. 7A and 7B show an example in which the pixel array region is formed by four pixels of 2 rows×2 columns. On the periphery of the pixel array region, an opening OP is provided and a pad electrode PE is arranged in the opening OP. FIG. 6A schematically shows a planar view of the cathodes of the two pixels 101 and their periphery, and FIG. 6B schematically shows a planar view of the anodes of the two pixels 101 and their periphery. FIG. 7A schematically shows a sectional view of the two pixels 101 shown in FIGS. 6A and 6B in the opposite side direction, and FIG. 7B schematically shows a sectional view of the two pixels 101 shown in FIGS. 6A and 6B in the diagonal direction. The opposite side direction indicates, for example, a direction connecting one side of the pixel and another side facing that side. The diagonal direction indicates, for example a direction connecting one corner of the pixel and another corner facing that corner.

The sensor substrate 301 can include a first semiconductor layer 302 having a first face S1 and a second face S2, and a first wiring structure 303. The circuit substrate 401 can include a second semiconductor layer 402 and a second wiring structure 403. The first wiring structure 303 can be arranged between the first face S1 of the first semiconductor layer 302 and the circuit substrate 401. The second wiring structure 403 can be arranged between the sensor substrate 301 and the second semiconductor layer 402.

Each pixel 101 can include a first semiconductor region 311 of the first conductivity type as the cathode of the APD 201 and a second semiconductor region 315 of the second conductivity type as the anode of the APD 201. The first semiconductor region 311 of the first conductivity type can be arranged on the side of the first face S1 of the first semiconductor layer 302, and the second semiconductor region 315 of the second conductivity type can be arranged on the side of the second face S2 of the first semiconductor layer 302. A predetermined voltage that can cause an avalanche multiplication operation can be supplied between the first semiconductor region 311 and the second semiconductor region 315. Each pixel 101 can include, between the first semiconductor region 311 as the cathode and the second semiconductor region 315 as the anode, a semiconductor region 313 of the first conductivity type arranged close to the first semiconductor region 311. The impurity concentration of the first conductivity type in the semiconductor region 313 is lower than that in the first semiconductor region 311 of the first conductivity type as the cathode.

Each pixel 101 can include a semiconductor region 312 of the second conductivity type between the first semiconductor region 311 of the first conductivity type as the cathode and the second semiconductor region 315 of the second conductivity type as the anode. For example, if the semiconductor region 312 serves as the same node as the second semiconductor region 315 as the anode, the semiconductor region 312 can also function as the anode. Then, a region between the first semiconductor region 311 and the semiconductor region 312 can be an avalanche multiplication region. A semiconductor region 316 of the first or second conductivity type can be arranged between the first face S1 and the semiconductor region 312 of the second conductivity type to surround the first semiconductor region 311 of the first conductivity type as the cathode. If the semiconductor region 316 has the first conductivity type, the impurity concentration of the first conductivity type in the semiconductor region 316 is lower than that in the semiconductor region 313 as the cathode. If the semiconductor region 316 has the second conductivity type, the impurity concentration of the second conductivity type in the semiconductor region 316 is lower than that in the semiconductor region 312 of the second conductivity type.

The semiconductor region 316 of the first or second conductivity type can be arranged between the semiconductor region 312 of the second conductivity type and the second semiconductor region 315 of the second conductivity type as the anode. If the semiconductor region 316 has the first conductivity type, the impurity concentration of the first conductivity type in the semiconductor region 316 may be lower than that in the semiconductor region 313. If the semiconductor region 316 has the second conductivity type, the impurity concentration of the second conductivity type in the semiconductor region 316 may be lower than that in the semiconductor region 312 of the second conductivity type.

A semiconductor region 317 of the first conductivity type may be arranged between the second semiconductor region 315 of the second conductivity type as the anode and the semiconductor region 312 of the second conductivity type. The semiconductor region 316 can include a portion arranged between the second semiconductor region 315 of the second conductivity type as the anode and the semiconductor region 317 of the first conductivity type and a portion surrounding the side surface of the semiconductor region 317 of the first conductivity type.

An isolation region 314 of the second conductivity type can be arranged between the adjacent pixels 101 among the plurality of pixels 101. A contact region 318 of the second conductivity type can be arranged between the isolation region 314 of the second conductivity type and the first face S1 to be electrically connected to the isolation region 314 of the second conductivity type. The impurity concentration of the second conductivity type in the contact region 318 of the second conductivity type is higher than that in the isolation region 314 of the second conductivity type. The isolation region 314 of the second conductivity type can be arranged to be electrically connected to the second semiconductor region 315 of the second conductivity type as the anode. An anode voltage (anode potential) can be supplied to the contact region 318 of the second conductivity type via an electrically conductive path arranged in the first wiring structure 303, thereby supplying the anode voltage (anode potential) to the second semiconductor region 315 of the second conductivity type as the anode. In the example shown in FIGS. 6A and 6B, four contact regions 318 are provided for each pixel 101. However, an arbitrary number of contact regions 318 can be provided for each pixel 101. Alternatively, two or more pixels 101 may be grouped, and one or a plurality of contact regions 318 may be provided for each group.

An insulating isolation portion 324 may be arranged in the isolation region 314 of the second conductivity type. The insulating isolation portion 324 can include a trench formed in the isolation region 314 and an isolator arranged to cover at least the surface (inner surface) of the trench. The insulator may be a film, and an insulating material or a conductive material can be filled in the film. The insulating isolation portion 324 can be called Deep Trench Isolation (DTI). The insulating isolation portion 324 or trench may be arranged to extend through the first semiconductor layer 302, or may be arranged not to extend through the first semiconductor layer 302. The insulating isolation portion 324 or trench may electrically isolate the isolation region 314 of the second conductivity type into an isolation region on the side of one pixel 101 and an isolation region on the side of the adjacent pixel 101. The insulating isolation portion 324 can include the trench, the insulator arranged to cover the inner surface of the trench, and a metal or a light shielding body arranged in the insulator. The insulating isolation portion 324 need not extend through the semiconductor layer.

A pinning layer 331 (indicated by a thick line) can be arranged on the side of the second face S2 of the second semiconductor region 315 of the second conductivity type as the anode. The pinning layer 331 can also be called a fixed charge film. The pinning layer 331 is arranged to be in contact with the second face S2, and can be formed by, for example, Atomic Layer Deposition (ALD). The pinning layer 331 can be made of a material selected from hafnium oxide, aluminum oxide, zirconium oxide, titanium oxide, tantalum oxide, and ruthenium oxide. The pinning layer 331 may include a plurality of layers. The above-described film covering the surface (inner surface) of the trench formed in the isolation region 314 may be the pinning layer 331.

The pinning layer 331 and the second face S2 can be covered with an insulating film 321. The insulating film 321 can be, for example, a silicon oxide film, a silicon nitride film, or a silicon oxynitride film. The insulating film 321 may include a plurality of films. An uneven structure 325 may be provided in the second semiconductor region 315 of the second conductivity type as the anode. The surface of the uneven structure 325 can be covered with the pinning layer 331. The uneven structure 325 functions to diffract incident light to prolong the optical path in the semiconductor layer 302. This is advantageous in improving the near-infrared sensitivity. The uneven structure 325 can be formed by the trench formed in the semiconductor layer 302, and the pinning layer 331 and the insulator arranged in the trench. The pinning layer 331 can be provided to cover the exposed surface of the semiconductor layer 302. That is, the pinning layer 331 is arranged along the trench of the uneven structure and the second face S2. The insulator arranged in the trench may be formed by the insulating film 321.

The insulating film 321 can be covered with a planarizing layer 322. A microlens 323 can be arranged on the planarizing layer 322. In the example shown in FIGS. 7A and 7B, the photoelectric conversion apparatus 100 is a back-side illumination photoelectric conversion apparatus in which light enters the second face S2 of the semiconductor layer 302 from the outside through the microlens 323. However, the photoelectric conversion apparatus 100 may be formed as a front-side illumination photoelectric conversion apparatus. Note that although not shown, a filter layer such as a color filter or an infrared cut-off filter may be provided on the side of the second face S2 of the semiconductor layer 302, in addition to the planarizing layer 322.

Figure 8A:
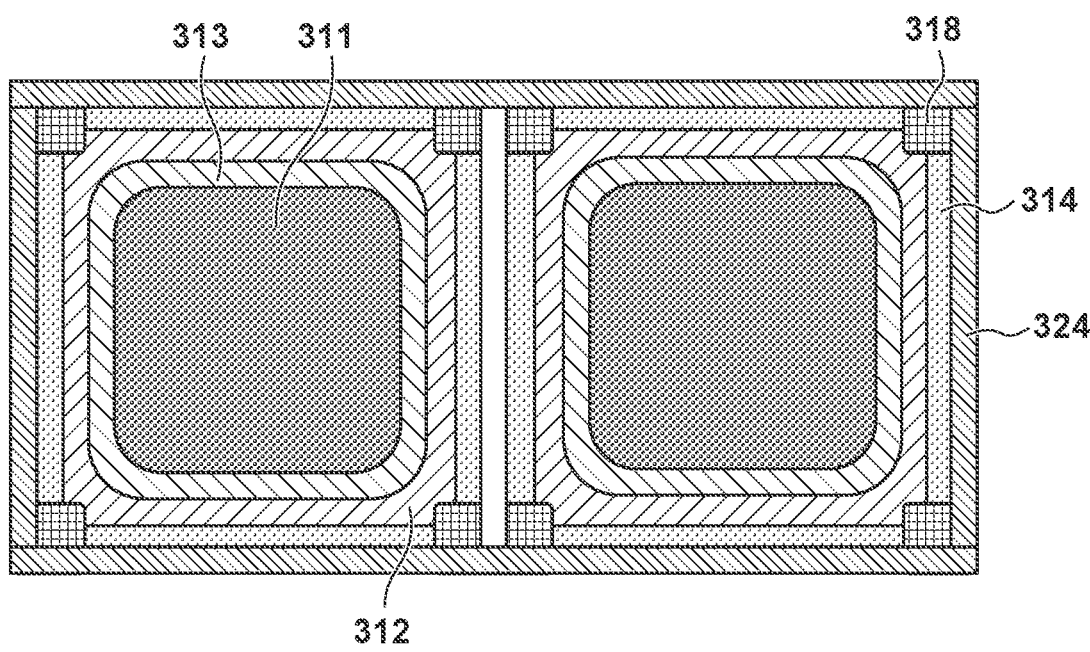
FIGS. 8A and 8B are views showing the second arrangement example of the pixel.
Figure 8B:
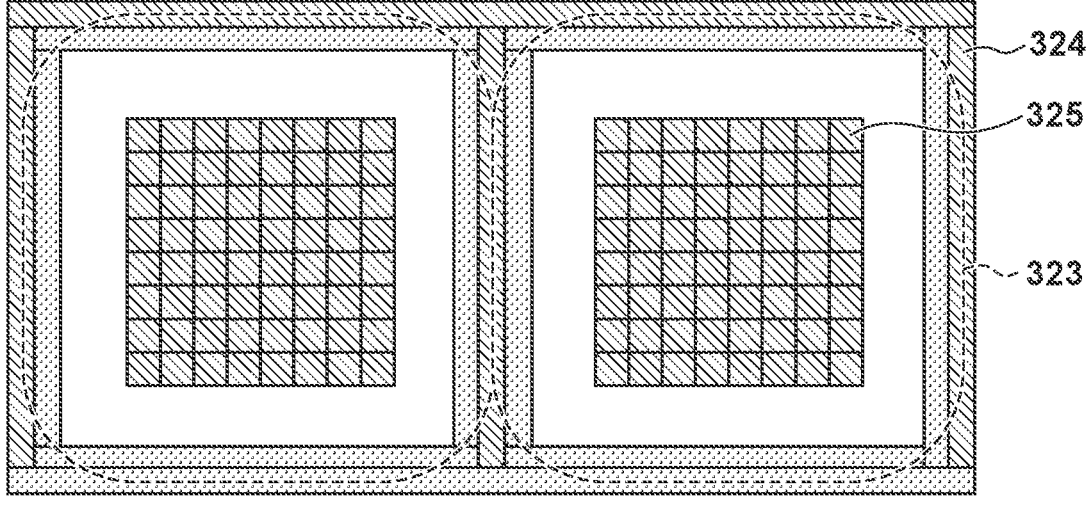

The second arrangement example of the pixels 101 will be described below with reference to FIGS. 8A, 8B, 9A, and 9B. Note that for the sake of convenience, FIGS. 9A and 9B show an example in which the pixel array region is formed by four pixels of 2 rows×2 columns. On the periphery of the pixel array region, the opening OP is provided and the pad electrode PE is arranged in the opening OP. FIG. 8A schematically shows a planar view of the cathodes of the two pixels 101 and their periphery, and FIG. 8B schematically shows a planar view of the anodes of the two pixels 101 and their periphery. FIG. 9A schematically shows a sectional view of the two pixels 101 shown in FIGS. 8A and 8B in the opposite side direction, and FIG. 9B schematically shows a sectional view of the two pixels 101 shown in FIGS. 8A and 8B in the diagonal direction.

The sensor substrate 301 can include the first semiconductor layer 302 having the first face S1 and the second face S2, and the first wiring structure 303. The circuit substrate 401 can include the second semiconductor layer 402 and the second wiring structure 403. The first wiring structure 303 can be arranged between the first face S1 of the first semiconductor layer 302 and the circuit substrate 401. The second wiring structure 403 can be arranged between the sensor substrate 301 and the second semiconductor layer 402.

Each pixel 101 can include the first semiconductor region 311 of the first conductivity type as the cathode of the APD 201 and the second semiconductor region 315 of the second conductivity type as the anode of the APD 201. The first semiconductor region 311 of the first conductivity type can be arranged on the side of the first face S1 of the first semiconductor layer 302, and the second semiconductor region 315 of the second conductivity type can be arranged on the side of the second face S2 of the first semiconductor layer 302. A predetermined voltage that can cause an avalanche multiplication operation can be supplied between the first semiconductor region 311 and the second semiconductor region 315. Each pixel 101 can include, between the first semiconductor region 311 as the cathode and the second semiconductor region 315 as the anode, the ring-shaped semiconductor region 313 of the first conductivity type arranged close to the peripheral portion in the first semiconductor region 311. The impurity concentration of the first conductivity type in the semiconductor region 313 is lower than that in the first semiconductor region 311 of the first conductivity type as the cathode.

Each pixel 101 can include, between the first semiconductor region 311 of the first conductivity type as the cathode and the second semiconductor region 315 of the second conductivity type as the anode, the semiconductor region 312 of the second conductivity type in the vicinity of the central portion in the first semiconductor region 311. For example, if the semiconductor region 312 serves as the same node as the second semiconductor region 315 as the anode, the semiconductor region 312 can also function as the anode. Then, a region between the first semiconductor region 311 and the semiconductor region 312 can be an avalanche multiplication region. The semiconductor region 316 of the first or second conductivity type can be arranged between the semiconductor region 312 of the second conductivity type and the second semiconductor region 315 of the second conductivity type as the anode. If the semiconductor region 316 has the first conductivity type, the impurity concentration of the first conductivity type in the semiconductor region 316 may be lower than that in the semiconductor region 313. If the semiconductor region 316 has the second conductivity type, the impurity concentration of the second conductivity type in the semiconductor region 316 may be lower than that in the semiconductor region 312 of the second conductivity type. The semiconductor region 316 can be arranged to surround the periphery of the semiconductor region 313 of the first conductivity type. Furthermore, the semiconductor region 316 can include a portion arranged between the semiconductor region 313 of the first conductivity type and the second semiconductor region 315 of the second conductivity type as the anode.

The isolation region 314 of the second conductivity type can be arranged between the adjacent pixels 101 among the plurality of pixels 101. The contact region 318 of the second conductivity type can be arranged between the isolation region 314 of the second conductivity type and the first face S1 to be electrically connected to the isolation region 314 of the second conductivity type. The impurity concentration of the second conductivity type in the contact region 318 of the second conductivity type is higher than that in the isolation region 314 of the second conductivity type. The isolation region 314 of the second conductivity type can be arranged to be electrically connected to the second semiconductor region 315 of the second conductivity type as the anode. An anode voltage (anode potential) can be supplied to the contact region 318 of the second conductivity type via an electrically conductive path arranged in the first wiring structure 303, thereby supplying the anode voltage (anode potential) to the second semiconductor region 315 of the second conductivity type as the anode. In the example shown in FIGS. 8A and 8B, four contact regions 318 are provided for each pixel 101. However, an arbitrary number of contact regions 318 can be provided for each pixel 101. Alternatively, two or more pixels 101 may be grouped, and one or a plurality of contact regions 318 may be provided for each group.

The insulating isolation portion 324 may be arranged in the isolation region 314 of the second conductivity type. The insulating isolation portion 324 can include a trench formed in the isolation region 314 and an isolator arranged to cover at least the surface (inner surface) of the trench. The insulator may be a film, and an insulating material or a conductive material can be filled in the film. The insulating isolation portion 324 can be called Deep Trench Isolation (DTI). The insulating isolation portion 324 or trench may be arranged to extend through the first semiconductor layer 302, or may be arranged not to extend through the first semiconductor layer 302. The insulating isolation portion 324 or trench may electrically isolate the isolation region 314 of the second conductivity type into an isolation region on the side of one pixel 101 and an isolation region on the side of the adjacent pixel 101.

The pinning layer 331 (indicated by a thick line) can be arranged on the side of the second face S2 of the second semiconductor region 315 of the second conductivity type as the anode. The pinning layer 331 can also be called a fixed charge film. The pinning layer 331 is arranged to be in contact with the second face S2, and can be formed by, for example, Atomic Layer Deposition (ALD). The pinning layer 331 can be formed by, for example, amorphous silicon, a hafnium oxide film, or an aluminum oxide film. The pinning layer 331 and the second face S2 can be covered with the insulating film 321. The insulating film 321 can be, for example, an SiO film, an SiN film, or an SiON film. The uneven structure 325 may be provided in the second semiconductor region 315 of the second conductivity type as the anode. The surface of the uneven structure 325 can be covered with the pinning layer 331. The uneven structure 325 functions to diffract incident light to prolong the optical path in the semiconductor layer 302. This is advantageous in improving the near-infrared sensitivity.

The insulating film 321 can be covered with the planarizing layer 322. The microlens 323 can be arranged on the planarizing layer 322. In the example shown in FIGS. 9A and 9B, the photoelectric conversion apparatus 100 is a back-side illumination photoelectric conversion apparatus in which light enters the second face S2 of the semiconductor layer 302 from the outside through the microlens 323. However, the photoelectric conversion apparatus 100 may be formed as a front-side illumination photoelectric conversion apparatus.

Figure 10A:
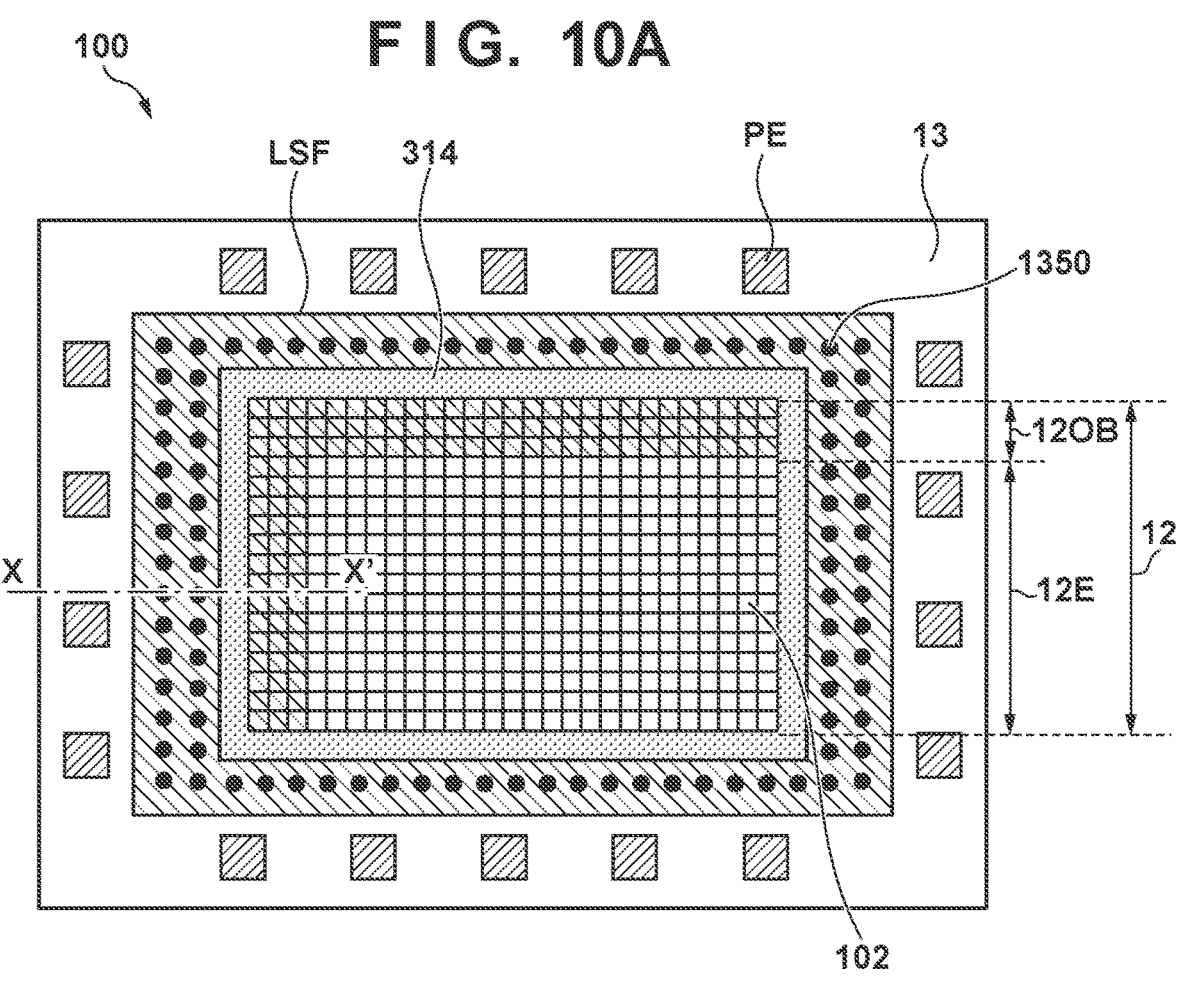
FIGS. 10A and 10B are plan views showing the arrangement of a photoelectric conversion apparatus according to a first embodiment.
Figure 10B:
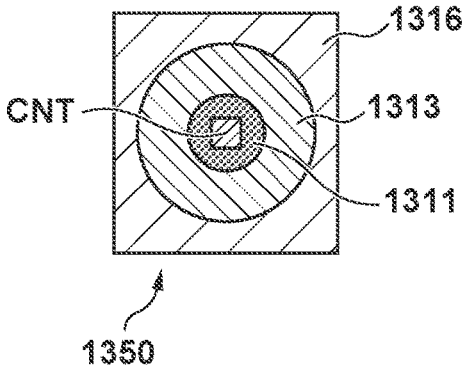

The arrangement of a photoelectric conversion apparatus 100 according to the first embodiment will be described below with reference to FIGS. 10A, 10B, and 11. As the photoelectric conversion apparatus 100 of the first embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. More specifically, the photoelectric conversion apparatus of the first embodiment is different from the first arrangement example in that, for example, neither the insulating isolation portion nor the uneven structure is provided.

The photoelectric conversion apparatus 100 of the first embodiment includes a semiconductor layer 302 (or a sensor substrate 301 from another viewpoint) including a pixel array region 12 with a plurality of pixels 101 and a peripheral region 13 arranged on the periphery of the pixel array region 12. The pixel array region 12 can include an effective pixel region 12E where the pixels (effective pixels) 101 for outputting signals corresponding to incident light are arranged, and an OB pixel region 120B where the pixels (OB pixels or light-shielded pixels) 101 shielded from light are arranged. The OB pixel region 120B can be arranged along at least part of the outer periphery of the effective pixel region 12E. The OB pixel region 120B can typically be arranged to surround the effective pixel region 12E. In the peripheral region 13, at least one pad electrode PE or typically a plurality of pad electrodes PE can be arranged. In each OB pixel 101, an APD 201 including an anode and a cathode is shielded from light by a light shielding film LSM. The pixel 101 of the OB pixel region 120B can have the same arrangement as that of the pixel 101 of the effective pixel region 12E except that the APD 201 is shielded from light by the light shielding film LSM.

The one or the plurality of charge discharge units 1350 can be arranged in the peripheral region 13. Referring to FIG. 10A, the one charge discharge unit 1350 is indicated by a solid circle. FIG. 10B shows a schematic planar view of the one charge discharge unit 1350. In this example, the plurality of charge discharge units 1350 are preferably arranged at a predetermined pitch along each of the four sides of the pixel array region 12. The predetermined pitch is preferably larger than the array pitch of the plurality of pixels 101 in the pixel array region 12. The plurality of charge discharge units 1350 can be arranged along each of the four sides of the pixel array region 12 to form a plurality of columns. The plurality of charge discharge units 1350 may be arranged in a checkerboard pattern along each of the four sides of the pixel array region 12.

Figure 11:
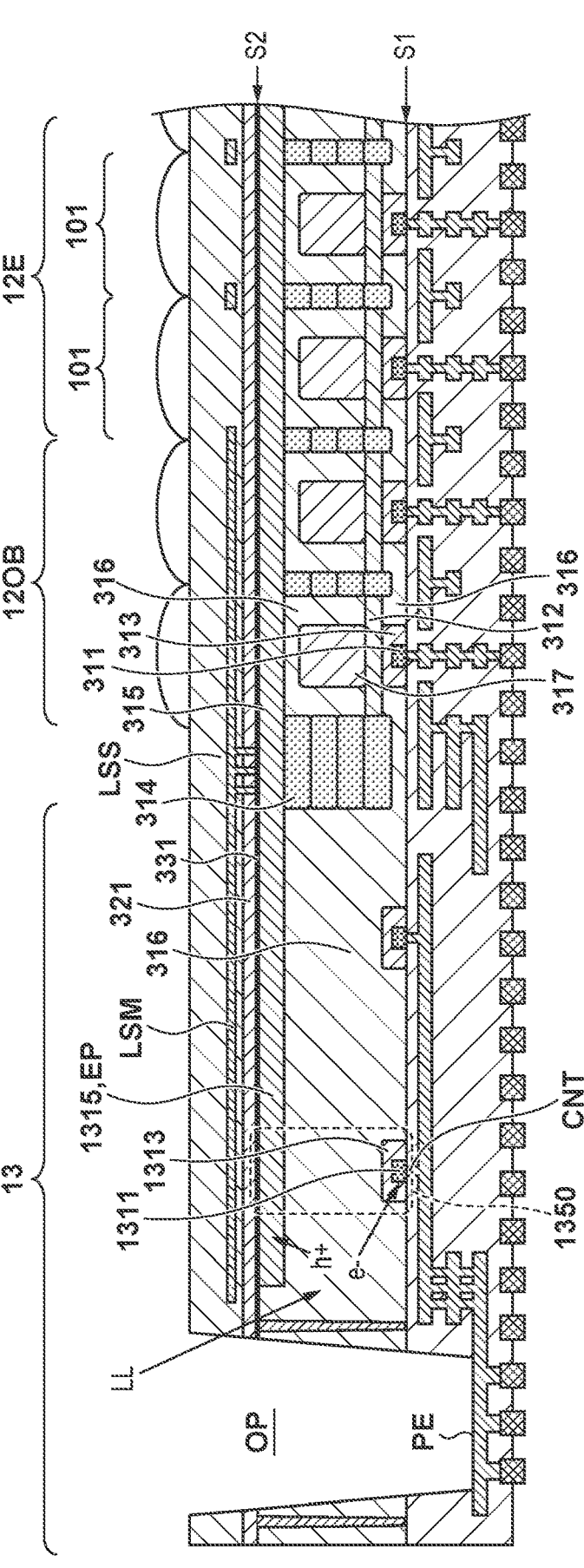
FIG. 11 is a sectional view showing the arrangement of the photoelectric conversion apparatus according to the first embodiment.

As exemplified in FIG. 11, the semiconductor layer 302 has a first face S1 and a second face S2. Each pixel 101 arranged in the pixel array region 12 (the effective pixel region 12E or the OB pixel region 120B) can have the same arrangement as the first arrangement example described with reference to FIGS. 6A, 6B, 7A, and 7B. A description will be provided with reference to FIGS. 11, 6A, 6B, 7A, and 7B. Each pixel 101 can include a first semiconductor region 311 of the first conductivity type as the cathode of the APD 201, and a second semiconductor region 315 of the second conductivity type as the anode of the APD 201. The first semiconductor region 311 of the first conductivity type can be arranged on the side of the first face S1 of the first semiconductor layer 302, and the second semiconductor region 315 of the second conductivity type can be arranged on the side of the second face S2 of the first semiconductor layer 302. A predetermined voltage that can cause an avalanche multiplication operation can be supplied between the first semiconductor region 311 and the second semiconductor region 315. Each pixel 101 can include, between the first semiconductor region 311 as the cathode and the second semiconductor region 315 as the anode, a semiconductor region 313 of the first conductivity type arranged close to the first semiconductor region 311. The impurity concentration of the first conductivity type in the semiconductor region 313 is lower than that in the first semiconductor region 311 of the first conductivity type as the cathode.

Each pixel 101 can include a semiconductor region 312 of the second conductivity type between the first semiconductor region 311 of the first conductivity type as the cathode and the second semiconductor region 315 of the second conductivity type as the anode. A semiconductor region 316 of the first or second conductivity type can be arranged between the first face S1 and the semiconductor region 312 of the second conductivity type to surround the first semiconductor region 311 of the first conductivity type as the cathode. If the semiconductor region 316 has the first conductivity type, the impurity concentration of the first conductivity type in the semiconductor region 316 is lower than that in the semiconductor region 313 as the cathode. If the semiconductor region 316 has the second conductivity type, the impurity concentration of the second conductivity type in the semiconductor region 316 is lower than that in the semiconductor region 312 of the second conductivity type.

The semiconductor region 316 of the first or second conductivity type can be arranged between the semiconductor region 312 of the second conductivity type and the second semiconductor region 315 of the second conductivity type as the anode. If the semiconductor region 316 has the first conductivity type, the impurity concentration of the first conductivity type in the semiconductor region 316 may be lower than that in the semiconductor region 313. If the semiconductor region 316 has the second conductivity type, the impurity concentration of the second conductivity type in the semiconductor region 316 may be lower than that in the semiconductor region 312 of the second conductivity type.

A semiconductor region 317 of the first conductivity type may be arranged between the second semiconductor region 315 of the second conductivity type as the anode and the semiconductor region 312 of the second conductivity type. The semiconductor region 316 can include a portion arranged between the second semiconductor region 315 of the second conductivity type as the anode and the semiconductor region 317 of the first conductivity type and a portion surrounding the side surface of the semiconductor region 317 of the first conductivity type.

A isolation region 314 of the second conductivity type can be arranged between the adjacent pixels 101 among the plurality of pixels 101. A contact region 318 of the second conductivity type can be arranged between the isolation region 314 of the second conductivity type and the first face S1 to be electrically connected to the isolation region 314 of the second conductivity type. The impurity concentration of the second conductivity type in the contact region 318 of the second conductivity type is higher than that in the isolation region 314 of the second conductivity type. The isolation region 314 of the second conductivity type can be arranged to be electrically connected to the second semiconductor region 315 of the second conductivity type as the anode. An anode voltage (anode potential) can be supplied to the contact region 318 of the second conductivity type via an electrically conductive path arranged in a first wiring structure 303, thereby supplying the anode voltage (anode potential) to the second semiconductor region 315 of the second conductivity type as the anode.

An insulating isolation portion 324 may be arranged in the isolation region 314 of the second conductivity type. The insulating isolation portion 324 can include a trench formed in the isolation region 314 and an isolator arranged to cover at least the surface (inner surface) of the trench. The insulator may be a film, and an insulating material or a conductive material can be filled in the film. The insulating isolation portion 324 can be called Deep Trench Isolation (DTI). The insulating isolation portion 324 or trench may be arranged to extend through the first semiconductor layer 302, or may be arranged not to extend through the first semiconductor layer 302. The insulating isolation portion 324 or trench may electrically isolate the isolation region 314 of the second conductivity type into an isolation region on the side of one pixel 101 and an isolation region on the side of the adjacent pixel 101.

A pinning layer 331 (indicated by a thick line) can be arranged on the side of the second face S2 of the second semiconductor region 315 of the second conductivity type as the anode. The pinning layer 331 can also be called a fixed charge film. The pinning layer 331 is arranged to be in contact with the second face S2, and can be formed by, for example, Atomic Layer Deposition (ALD). The pinning layer 331 can be made of, for example, amorphous silicon, hafnium oxide, or aluminum oxide. The pinning layer 331 and the second face S2 can be covered with an insulating film 321.

The peripheral region 13 can include a third semiconductor region 1311 of the first conductivity type arranged on the side of the first face S1, and a fourth semiconductor region 1315 of the second conductivity type arranged apart from the third semiconductor region 1311. The fourth semiconductor region 1315 can include an extending portion EP extending in parallel to the second face S2. A predetermined voltage can be supplied between the third semiconductor region 1311 and the fourth semiconductor region 1315. The voltage supplied between the third semiconductor region 1311 and the fourth semiconductor region 1315 may be the same as the voltage supplied between the first semiconductor region 311 as the anode and the second semiconductor region 315 as the cathode. The p-n junction is formed between the third semiconductor region 1311 of the first conductivity type and the fourth semiconductor region 1315 of the second conductivity type, and is reverse-biased by the voltage supplied between the third semiconductor region 1311 and the fourth semiconductor region 1315, thereby functioning as a photodiode.

The peripheral region 13 can further include, between the third semiconductor region 1311 of the first conductivity type and the fourth semiconductor region 1315 of the second conductivity type, a fifth semiconductor region 1313 of the first conductivity type in which the impurity concentration of the first conductivity type is lower than that in the third semiconductor region 1311. The fifth semiconductor region 1313 can be arranged close to the third semiconductor region 1311. The fifth semiconductor region 1313 of the first conductivity type is arranged to surround the side surface of the third semiconductor region 1311. The fifth semiconductor region 1313 of the first conductivity type can include, between the third semiconductor region 1311 and the fourth semiconductor region 1315, a portion arranged to be in contact with the third semiconductor region 1311. The third semiconductor region 1311 of the first conductivity type, the fourth semiconductor region 1315 of the second conductivity type, and the fifth semiconductor region 1313 of the first conductivity type can form the charge discharge unit 1350. The fifth semiconductor region 1313 of the first conductivity type can function to relax the electric field in the vicinity of the third semiconductor region 1311 of the first conductivity type.

The third semiconductor region 1311 of the first conductivity type can be formed in a region having the same depth (for example, the depth from the first face S1) as that of the first semiconductor region 311 of the first conductivity type as the cathode of the pixel 101 of the pixel array region 12. The first semiconductor region 311 and the third semiconductor region 1311 can be arranged between the first face S1 and the first depth. The impurity concentration of the first conductivity type in the third semiconductor region 1311 can be equal to that in the first semiconductor region 311 of the pixel 101 of the pixel array region 12. The third semiconductor region 1311 of the first conductivity type can be formed simultaneously with the first semiconductor region 311 of the first conductivity type of the pixel 101 of the pixel array region 12.

The fourth semiconductor region 1315 of the second conductivity type can be formed in a region having the same depth (for example, the depth from the first face S1) as that of the second semiconductor region 315 of the second conductivity type as the anode of the pixel 101 of the pixel array region 12. The second semiconductor region 315 and the fourth semiconductor region 1315 can be arranged between the second face S2 and the second depth. The impurity concentration of the second conductivity type in the fourth semiconductor region 1315 can be equal to that in the second semiconductor region 315 of the pixel 101 of the pixel array region 12. The fourth semiconductor region 1315 of the second conductivity type can be formed simultaneously with the second semiconductor region 315 of the second conductivity type of the pixel 101 of the pixel array region 12. The fourth semiconductor region 1315 of the second conductivity type in the peripheral region 13 can be formed integrally with the second semiconductor region 315 of the second conductivity type in the pixel array region 12.

The semiconductor region 316 of the first or second conductivity type can be arranged between the fifth semiconductor region 1313 of the first conductivity type and the fourth semiconductor region 1315 of the second conductivity type. If the semiconductor region 316 has the first conductivity type, the impurity concentration of the first conductivity type in the semiconductor region 316 is lower than that in the semiconductor region 1313. If the semiconductor region 316 has the second conductivity type, the impurity concentration of the second conductivity type in the semiconductor region 316 is lower than that in the semiconductor region 1315 of the second conductivity type. The semiconductor region 316 in the peripheral region 13 can have the same conductivity type and the same impurity concentration as those of the semiconductor region 316 in the pixel array region 12. The semiconductor region 316 can be an epitaxial growth layer.

Light (or a photon) LL can enter the semiconductor region 316 of the peripheral region 13 through, for example, the opening OP for the pad electrode PE or a region where there is no light shielding film LSM. The light LL entering the semiconductor region 316 of the peripheral region 13 can generate electrons (e−) and holes (h+) by photoelectric conversion. If no charge discharge unit 1350 exists in the peripheral region 13, the electrons and holes generated by the light entering the peripheral region 13 can move to the pixel array region 12 to cause an avalanche multiplication operation. Alternatively, the electrons and holes generated by the light entering the peripheral region 13 are recombined to generate light, and the light may be detected by the pixel 101 of the pixel array region 12. Alternatively, the light entering the peripheral region 13 may cause an avalanche multiplication operation. This may degrade the quality of an image or signal detected by the photoelectric conversion apparatus 100.

In the first embodiment, the charge discharge unit 1350 provided in the peripheral region 13 can operate to discharge the electrons and holes generated by the light entering the peripheral region 13. If the first conductivity type is an n type, and the second conductivity type is a p type, the generated electrons are attracted by the third semiconductor region 1311 of the first conductivity type, and the generated holes are attracted by the fourth semiconductor region 1315 of the second conductivity type.

In the peripheral region 13, the pinning layer 331 (indicated by the thick line) can be arranged on the side of the second face S2 of the fourth semiconductor region 1315 of the second conductivity type. The pinning layer 331 is arranged to be in contact with the second face S2, and can be formed by, for example, Atomic Layer Deposition (ALD). The pinning layer 331 can be made of, for example, amorphous silicon, hafnium oxide, or aluminum oxide. The pinning layer 331 and the second face S2 can be covered with the insulating film 321 such as an SiN film. The pinning layer 331 in the peripheral region 13 may have the same composition as that of the pinning layer 331 in the pixel array region 12, and can be formed simultaneously with the pinning layer 331 in the pixel array region 12.

The semiconductor layer 302 can include the isolation region 314 of the second conductivity type in a boundary region between the pixel array region 12 and the peripheral region 13. The isolation region 314 can electrically be connected to the second semiconductor region 315 of the second conductivity type, and can be supplied with the same potential as that of the second semiconductor region 315 of the second conductivity type. The isolation region 314 of the second conductivity type arranged in the boundary region between the pixel array region 12 and the peripheral region 13 can also form the charge discharge unit 1350.

The light shielding film LSM may include a light shielding structure LSS in the boundary region between the pixel array region 12 and the peripheral region 13, for example, in the isolation region 314 in a planar view. In one example, the light shielding film LSM can electrically be connected to the second semiconductor region 315 of the second conductivity type and/or the fourth semiconductor region 1315 of the second conductivity type via the light shielding structure LSS. The light shielding structure LSS can include, for example, one or a plurality of walls. The one or the plurality of walls can electrically be connected to the second semiconductor region 315 of the second conductivity type and/or the fourth semiconductor region 1315 of the second conductivity type by extending through the pinning layer 331.

Figure 13:
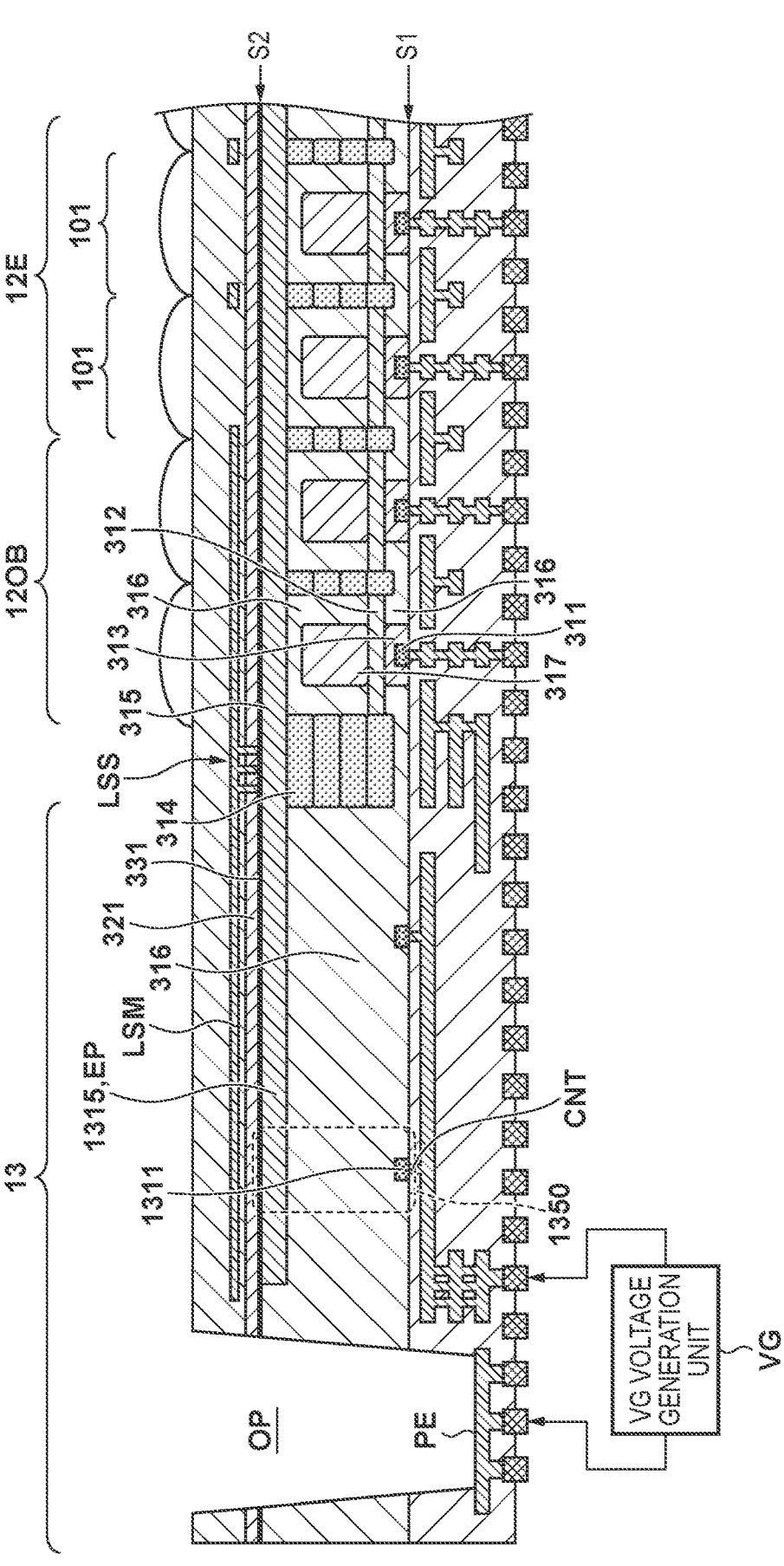
FIG. 13 is a sectional view showing the arrangement of the photoelectric conversion apparatus according to the second embodiment.

The arrangement of a photoelectric conversion apparatus 100 according to the second embodiment will be described below with reference to FIGS. 12A, 12B, and 13. As the photoelectric conversion apparatus 100 of the second embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. The photoelectric conversion apparatus 100 of the second embodiment is different from the photoelectric conversion apparatus 100 of the first embodiment in terms of the arrangement of the charge discharge unit 1350 and/or a voltage supplied to the charge discharge unit 1350.

The photoelectric conversion apparatus 100 of the second embodiment can include a voltage generation unit VG. The voltage generation unit VG can generate a voltage (potential) to be supplied to a third semiconductor region 1311 of the first conductivity type. From another viewpoint, the voltage generation unit VG can generate a voltage to be supplied between the third semiconductor region 1311 of the first conductivity type and a fourth semiconductor region 1315 of the second conductivity type. The voltage generation unit VG can generate the voltage (potential) to be supplied to the third semiconductor region 1311 of the first conductivity type, by, for example, transforming a voltage supplied to one of a plurality of pad electrodes PE. The voltage generation unit VG can be arranged in, for example, a circuit substrate 401. Instead of this arrangement, the voltage (potential) to be supplied to the third semiconductor region 1311 of the first conductivity type may be supplied from the outside of the photoelectric conversion apparatus 100.

The voltage supplied to the charge discharge unit 1350, or the voltage supplied between the third semiconductor region 1311 of the first conductivity type and the fourth semiconductor region 1315 of the second conductivity type is lower than a voltage supplied between the anode and cathode of a pixel array region 12. In one example, the voltage supplied to the charge discharge unit 1350 can be ½ or less of the voltage supplied between the anode and cathode of the pixel array region 12. Alternatively, the voltage (potential) supplied to the third semiconductor region 1311 of the first conductivity type may be equal to the ground potential in the photoelectric conversion apparatus 100. This is advantageous in simplifying the structure of the photoelectric conversion apparatus 100.

If the electric field generated on the periphery of the third semiconductor region 1311 of the first conductivity type is sufficiently weak, the fifth semiconductor region 1313 provided in the charge discharge unit 1350 in the first embodiment may be eliminated. FIGS. 12A, 12B, and 13 exemplify the charge discharge unit 1350 from which the fifth semiconductor region 1313 has been eliminated. Furthermore, this voltage can be applied to the arrangement including the insulating isolation portion shown in FIGS. 7A and 7B.

The arrangement of a photoelectric conversion apparatus 100 according to the third embodiment will be described below with reference to FIGS. 14A, 14B, 15A, and 15B. As the photoelectric conversion apparatus 100 of the third embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. The photoelectric conversion apparatus 100 of the third embodiment is different from the photoelectric conversion apparatus 100 of the first embodiment in that an insulating isolation portion 324 is provided. Furthermore, for example, the photoelectric conversion apparatus 100 of the third embodiment is different from the photoelectric conversion apparatus 100 of the first embodiment in that an uneven structure 325 is provided. Note that the uneven structure 325 shown in FIGS. 15A and 15B is the same as that shown in FIGS. 7A and 7B.

An isolation region 314 of the second conductivity type can be arranged between adjacent pixels 101 among a plurality of pixels 101. Similarly, the isolation region 314 of the second conductivity type can be arranged between a pixel array region 12 and a peripheral region 13. A contact region 318 of the second conductivity type can be arranged between the isolation region 314 of the second conductivity type and a first face 51 to be electrically connected to the isolation region 314 of the second conductivity type. The impurity concentration of the second conductivity type in the contact region 318 of the second conductivity type is higher than that in the isolation region 314 of the second conductivity type. The isolation region 314 of the second conductivity type can be arranged to be electrically connected to a second semiconductor region 315 of the second conductivity type as the anode. An anode voltage (anode potential) can be supplied to the contact region 318 of the second conductivity type via an electrically conductive path arranged in a first wiring structure 303, thereby supplying the anode voltage (anode potential) to the second semiconductor region 315 of the second conductivity type as the anode.

In the pixel array region 12, the insulating isolation portion 324 may be arranged in the isolation region 314 of the second conductivity type. Similarly, in the peripheral region 13, the insulating isolation portion 324 may be arranged in the isolation region 314 of the second conductivity type. The insulating isolation portion 324 can include a trench formed in the isolation region 314 and an isolator arranged to cover at least the surface (inner surface) of the trench. The insulator may be a film, and an insulating material or a conductive material can be filled in the film. The film may be a pinning layer 331. The insulating isolation portion 324 can be called Deep Trench Isolation (DTI). The insulating isolation portion 324 or trench may be arranged to extend through a first semiconductor layer 302, or may be arranged not to extend through the first semiconductor layer 302. As shown in FIG. 15A, a plurality of insulating isolation portions may be provided to sandwich an opening OP. The refractive index difference between the insulating material of the insulating isolation portion and the first semiconductor layer 302 can reduce the incidence of light from the opening OP.

In the pixel array region 12, the insulating isolation portion 324 or trench may electrically isolate the isolation region 314 of the second conductivity type into an isolation region on the side of one pixel 101 and an isolation region on the side of the adjacent pixel 101. Similarly, in the peripheral region 13, the insulating isolation portion 324 or trench can be arranged to electrically isolate the isolation region 314 of the second conductivity type into a first isolation region 314A on the side of the pixel array region 12 and a second isolation region 314B on the side of the peripheral region 13. The first wiring structure 303 stacked on the first semiconductor layer 302 can include a first electrically conductive path that applies a potential to the first isolation region 314A and a second electrically conductive path that applies a potential to the second isolation region 314B. The first electrically conductive path and the second electrically conductive path may electrically be connected in the first wiring structure 303. Each electrically conductive path can include, for example, a contact plug and a wiring.

The arrangement of a photoelectric conversion apparatus 100 according to the fourth embodiment will be described below with reference to FIGS. 16A and 16B. As the photoelectric conversion apparatus 100 of the fourth embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. The photoelectric conversion apparatus 100 of the fourth embodiment has an arrangement obtained by eliminating the semiconductor region 1315 of the second conductivity type from the photoelectric conversion apparatus 100 of the third embodiment. Note that an uneven structure 325 shown in FIGS. 16A and 16B is the same as that shown in FIGS. 7A and 7B.

In the fourth embodiment as well, the charge discharge unit 1350 provided in a peripheral region 13 can operate to discharge electrons and holes generated by light entering the peripheral region 13. If the first conductivity type is an n type, and the second conductivity type is a p type, the generated electrons can be attracted by a third semiconductor region 1311 of the first conductivity type and discharged. On the other hand, the generated holes can be discharged via a semiconductor region of the second conductivity type formed in the vicinity of the surface of a semiconductor region 316 (in the vicinity of the second face S2) by charges induced by a pinning layer 331 in the vicinity of the surface, an isolation region 314, and a second semiconductor region 315 of the second conductivity type. The semiconductor region of the second conductivity type formed in the surface region of the semiconductor region 316 by the charges induced by the pinning layer 331 functions, similar to the above-described fourth semiconductor region 1315 (extending portion EP). If the second conductivity type is the p type, the charges induced by the pinning layer 331 are holes.

The arrangement of a photoelectric conversion apparatus 100 according to the fifth embodiment will be described below with reference to FIG. 17. As the photoelectric conversion apparatus 100 of the fifth embodiment, an example in which a charge discharge unit 1350 is applied to the photoelectric conversion apparatus 100 having an arrangement according to the second arrangement example described with reference to FIGS. 8A, 8B, 9A, and 9B is provided. A description of the same matters as those described above will be omitted. The first to fourth embodiments can also be applied to the photoelectric conversion apparatus 100 having the arrangement according to the second arrangement example described with reference to FIGS. 8A, 8B, 9A, and 9B. Note that an uneven structure 325 shown in FIG. 17 is the same as that shown in FIGS. 9A and 9B.

The arrangement of a photoelectric conversion apparatus 100 according to the sixth embodiment will be described below with reference to FIG. 18. As the photoelectric conversion apparatus 100 of the sixth embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. An uneven structure 325 shown in FIG. 18 is the same as that shown in FIGS. 7A and 7B and a description thereof will be omitted.

A fourth semiconductor region 1315 of the second conductivity type forming part of the charge discharge unit 1350 can include one or a plurality of protruding portions P1 protruding from an extending portion EP toward a first face S1. The one or the plurality of protruding portions P1 correspond to a semiconductor region or regions of the second conductivity type. The impurity concentration of the second conductivity type in the one or the plurality of protruding portions P1 may be lower than that in the extending portion EP, or may be equal to that in the extending portion EP.

If the fourth semiconductor region 1315 of the second conductivity type includes the plurality of protruding portions P1, the plurality of protruding portions P1 can be arranged at a predetermined pitch. The direction of the predetermined pitch is, for example, a direction perpendicular to a side of a pixel array region 12 or a direction parallel to the side of the pixel array region 12. The predetermined pitch is preferably larger than the array pitch of a plurality of pixels 101 in the pixel array region 12. The array pitch of the plurality of protruding portions P1 may be the same as or different from that of a plurality of third semiconductor regions 1311. The plurality of protruding portions P1 and the plurality of third semiconductor regions 1311 can alternately be arranged in a planar view.

The arrangement of a photoelectric conversion apparatus 100 according to the seventh embodiment will be described below with reference to FIG. 19. As the photoelectric conversion apparatus 100 of the seventh embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. An uneven structure 325 shown in FIG. 19 is the same as that shown in FIGS. 7A and 7B and a description thereof will be omitted.

A fourth semiconductor region 1315 of the second conductivity type forming part of the charge discharge unit 1350 can include at least one second extending portion EP2, that is arranged along an extending portion EP, to be in contact with the extending portion EP between the extending portion EP and a first face S1. The second extending portion EP2 is a semiconductor region of the second conductivity type. The impurity concentration of the second conductivity type in the second extending portion EP2 may be lower than that in the extending portion EP or may be equal to that in the extending portion EP. If the fourth semiconductor region 1315 of the second conductivity type includes the plurality of second extending portions EP2, the impurity concentration of the second conductivity type in the plurality of second extending portions EP2 can be lowered stepwise as the distance from a second face S2 is larger.

The arrangement of a photoelectric conversion apparatus 100 according to the eighth embodiment will be described below with reference to FIG. 20. As the photoelectric conversion apparatus 100 of the eighth embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. An uneven structure 325 shown in FIG. 20 is the same as that shown in FIGS. 7A and 7B and a description thereof will be omitted.

A fourth semiconductor region 1315 of the second conductivity type forming part of the charge discharge unit 1350 can include a plurality of first protruding portions P1 protruding from an extending portion EP toward a first face S1. The plurality of first protruding portions P1 are semiconductor regions of the second conductivity type. The impurity concentration of the second conductivity type in the plurality of first protruding portions P1 may be lower than that in the extending portion EP, or may be equal to that in the extending portion EP.

The plurality of first protruding portions P1 can be arranged at a predetermined pitch. The direction of the predetermined pitch is, for example, a direction perpendicular to a side of a pixel array region 12 or a direction parallel to the side of the pixel array region 12. The predetermined pitch is preferably larger than the array pitch of a plurality of pixels 101 in the pixel array region 12. The array pitch of the plurality of first protruding portions P1 may be the same as or different from that of a plurality of third semiconductor regions 1311. The plurality of first protruding portions P1 and the plurality of third semiconductor regions 1311 can alternately be arranged in a planar view.

The fourth semiconductor region 1315 of the second conductivity type forming part of the charge discharge unit 1350 can include a plurality of second protruding portions P2 protruding from the extending portion EP toward the first face S1. The plurality of second protruding portions P2 are semiconductor regions of the second conductivity type. The impurity concentration of the second conductivity type in the plurality of second protruding portions P2 may be lower than that in the extending portion EP, or may be equal to that in the extending portion EP.

The plurality of second protruding portions P2 can be arranged at a predetermined pitch. The direction of the predetermined pitch is, for example, a direction perpendicular to the side of the pixel array region 12 or a direction parallel to the side of the pixel array region 12. The predetermined pitch is preferably larger than the array pitch of the plurality of pixels 101 in the pixel array region 12. The array pitch of the plurality of second protruding portions P2 may be the same as or different from that of the plurality of third semiconductor regions 1311. The plurality of second protruding portions P2 and the plurality of third semiconductor regions 1311 can alternately be arranged in a planar view. The plurality of first protruding portions P1 and the plurality of second protruding portions P2 can alternately be arranged in a planar view.

The plurality of second protruding portions P2 have a depth from a second face S2, which is smaller than that of the plurality of first protruding portions P1, and can be arranged so as to overlap the plurality of third semiconductor regions 1311 in a planar view.

The arrangement of a photoelectric conversion apparatus 100 according to the ninth embodiment will be described below with reference to FIG. 21. As the photoelectric conversion apparatus 100 of the ninth embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. An uneven structure 325 shown in FIG. 21 is the same as that shown in FIGS. 7A and 7B and a description thereof will be omitted.

A fourth semiconductor region 1315 of the second conductivity type forming part of the charge discharge unit 1350 can include a plurality of protruding portions P1 protruding from an extending portion EP toward a first face S1. The plurality of protruding portions P1 are semiconductor regions of the second conductivity type. The impurity concentration of the second conductivity type in the plurality of protruding portions P1 may be lower than that in the extending portion EP, or may be equal to that in the extending portion EP.

The plurality of protruding portions P1 can be arranged at a predetermined pitch. The direction of the predetermined pitch is, for example, a direction perpendicular to a side of a pixel array region 12 or a direction parallel to the side of the pixel array region 12. The predetermined pitch is preferably larger than the array pitch of a plurality of pixels 101 in the pixel array region 12. The array pitch of the plurality of protruding portions P1 may be the same as or different from that of a plurality of third semiconductor regions 1311. The plurality of protruding portions P1 and the plurality of third semiconductor regions 1311 can alternately be arranged in a planar view. In one example, the shortest distance between the plurality of third semiconductor regions 1311 and the first face 51 is smaller than the largest depth of a fifth semiconductor region 1313 of the first conductivity type from the first face 51.

The arrangement of a photoelectric conversion apparatus 100 according to the 10th embodiment will be described below with reference to FIG. 22. As the photoelectric conversion apparatus 100 of the 10th embodiment, an example in which a charge discharge unit 1350 is applied to the photoelectric conversion apparatus 100 having an arrangement according to the first arrangement example described with reference to FIGS. 6A, 6B, 7A, and 7B is provided. A description of the same matters as those described above will be omitted. An uneven structure 325 shown in FIG. 22 is the same as that shown in FIGS. 7A and 7B and a description thereof will be omitted.

A fourth semiconductor region 1315 of the second conductivity type forming part of the charge discharge unit 1350 can include a plurality of protruding portions P1 protruding from an extending portion EP toward a first face S1. The plurality of protruding portions P1 are semiconductor regions of the second conductivity type. The impurity concentration of the second conductivity type in the plurality of protruding portions P1 may be lower than that in the extending portion EP, or may be equal to that in the extending portion EP.

In the array direction of the plurality of protruding portions P1, which is parallel to the first face S1, a width W1 of each of the plurality of protruding portions P1 is larger than a width W2 of a pixel isolation region 314PX of the second conductivity type arranged between adjacent pixels 101 among a plurality of pixels 101. Alternatively, in the array direction, the maximum width of each of the plurality of protruding portions P1 is larger than the maximum width of the pixel isolation region 314PX of the second conductivity type arranged between the adjacent pixels 101 among the plurality of pixels 101. Alternatively, in the array direction, the minimum width of each of the plurality of protruding portions P1 is larger than the minimum width of the pixel isolation region 314PX of the second conductivity type arranged between the adjacent pixels 101 among the plurality of pixels 101.

A photoelectric conversion system incorporating the photoelectric conversion apparatus exemplarily described through each of the first to 10th embodiments will exemplarily be described below. FIG. 23 shows an example of the photoelectric conversion system. The photoelectric conversion apparatus described in each of the first to 10th embodiments is applicable to various photoelectric conversion systems. Examples of the applicable photoelectric conversion systems are a digital still camera, a digital camcorder, a monitoring camera, a copying machine, a facsimile apparatus, a mobile phone, an in-vehicle camera, and an observation satellite. A camera module including an image capturing apparatus and an optical system such as a lens is also included in the photoelectric conversion systems.

The photoelectric conversion system is formed as, for example, an image capturing system SYS. The image capturing system SYS is a camera or an information terminal having an imaging function. An image capturing apparatus IS can further include a package PKG accommodating the photoelectric conversion apparatus 100 formed as an image capturing device IC. The package PKG can include a base on which the image capturing device IC is fixed, a cover facing the image capturing device IC, and a connection member for connecting a terminal of the base and a terminal of the image capturing device IC. The image capturing apparatus IS can arrange and mount the plurality of image capturing devices IC on the common package PKG. The image capturing apparatus IS can also stack and mount the image capturing device IC and another semiconductor device IC on the common package PKG.

The image capturing system SYS can include an optical system OU that forms an image on the image capturing apparatus IS. The image capturing system SYS can include at least one of a control apparatus CU that controls the image capturing apparatus IS, a processing apparatus PU that processes a signal obtained from the image capturing apparatus IS, and a display apparatus DU that displays an image obtained from the image capturing apparatus IS. Furthermore, the image capturing system SYS may include a storage apparatus MU that stores the image obtained from the image capturing apparatus IS.

FIG. 24A exemplifies the configuration of a photoelectric conversion system applied to an in-vehicle camera. A photoelectric conversion system 2300 can include the photoelectric conversion apparatus 100 formed as an image capturing apparatus 2310. The photoelectric conversion system 2300 includes an image processing unit 2312 that performs image processing for a plurality of image data acquired by the image capturing apparatus 2310, and a parallax acquisition unit 2314 that calculates a parallax (the phase difference between parallax images) from the plurality of image data acquired by the photoelectric conversion system 2300. The photoelectric conversion system 2300 also includes a distance acquisition unit 2316 that calculates the distance up to a target object based on the calculated parallax, and a collision determination unit 2318 that determines, based on the calculated distance, whether there is collision possibility. Here, the parallax acquisition unit 2314 and the distance acquisition unit 2316 are examples of a distance information acquisition unit that acquires distance information up to a target object. That is, the distance information is information concerning a parallax, a defocus amount, a distance up to a target object, and the like. The collision determination unit 2318 may determine collision possibility using one of the pieces of distance information. The distance information acquisition unit may be implemented by exclusively designed hardware, or may be implemented by a software module. The distance information acquisition unit may be implemented by a Field Programmable Gate Array (FPGA) or Application Specific Integrated Circuit (ASIC), or may be implemented by a combination of these.

The photoelectric conversion system 2300 is connected to a vehicle information acquisition apparatus 2320, and can acquire vehicle information such as a vehicle speed, a yaw rate, and a steering angle. The photoelectric conversion system 2300 is also connected to a control ECU 2330 that is a control unit configured to output a control signal for generating a braking force to the vehicle based on the determination result of the collision determination unit 2318. Furthermore, the photoelectric conversion system 2300 is connected to an alarm device 2340 that generates an alarm to the driver based on the determination result of the collision determination unit 2318. For example, if collision possibility is high as the determination result of the collision determination unit 2318, the control ECU 2330 performs vehicle control of braking, releasing the accelerator pedal, or suppressing the engine output, thereby avoiding collision and reducing damage. The alarm device 2340 sounds an alarm, displays alarm information on the screen of a car navigation system or the like, or applies a vibration to the seat belt or a steering wheel, thereby making an alarm to the user. In this embodiment, the periphery of the vehicle, for example, the front or rear side is captured by the photoelectric conversion system 2300. FIG. 24B shows the photoelectric conversion system configured to capture the front side (image capturing range 2350) of the vehicle. The vehicle information acquisition apparatus 2320 sends an instruction to the photoelectric conversion system 2300 or the image capturing apparatus 2310. With this configuration, it is possible to further improve the accuracy of distance measurement.

An example in which control is executed so as not to collide with another vehicle has been explained above. The system can also be applied to control of performing automated driving following another vehicle or control of performing automated driving without deviating from a lane. Furthermore, the photoelectric conversion system can be applied not only to a vehicle such as an automobile but also to, for example, a moving body (moving apparatus) such as a ship, an airplane, or an industrial robot. In addition, the photoelectric conversion system can be applied not only to a moving body but also to an apparatus that broadly uses object recognition, such as an intelligent transport system (ITS).

FIG. 25 exemplifies the configuration of a photoelectric conversion system formed as a distance image sensor. A distance image sensor 40 includes an optical system 402, a photoelectric conversion apparatus 403, an image processing circuit 404, a monitor 405, and a memory 406. Then, the distance image sensor 40 can receive light (modulated light or pulsed light) projected from a light source apparatus 411 toward an object and reflected by the surface of the object, thereby acquiring a distance image corresponding to the distance up to the object.

The optical system 402 is formed by including one or a plurality of lenses, and guides image light (incident light) from the object to the photoelectric conversion apparatus 403 and forms an image on the light-receiving surface (sensor portion) of the photoelectric conversion apparatus 403. As the photoelectric conversion apparatus 403, the photoelectric conversion apparatus of each of the above-described embodiments is applied, and a distance signal indicating a distance obtained from a light reception signal output from the photoelectric conversion apparatus 403 is supplied to the image processing circuit 404.

The image processing circuit 404 performs image processing of creating a distance image based on the distance signal supplied from the photoelectric conversion apparatus 403. Then, the distance image (image data) obtained by the image processing is supplied to and displayed on the monitor 405, and supplied to and stored (recorded) in the memory 406. The distance image sensor 40 having such arrangement can acquire, for example, more correct distance image along with improvement in characteristic of pixels by applying the above-described photoelectric conversion apparatus.

FIG. 26 exemplifies the configuration of the photoelectric conversion system formed as an endoscopic surgery system 1003. FIG. 26 shows a state in which an operator (doctor) 1131 operates on a patient 1132 on a patient bed 1133 using an endoscopic surgery system 1003. As shown in FIG. 26, the endoscopic surgery system 1150 is formed from an endoscope 1100, a surgical tool 1110, and a cart 1134 on which various apparatuses for endoscopic surgery are mounted.

The endoscope 1100 includes a lens barrel 1101 including a region of a predetermined length from the distal end, which is inserted into the body cavity of the patient 1132, and a camera head 1102 connected to the proximal end of the lens barrel 1101. In the example shown in FIG. 26, the endoscope 1100 formed as a so-called hard mirror including the hard lens barrel 1101 is shown but the endoscope 1100 may be formed as a so-called soft mirror including a soft lens barrel.

An opening in which an objective lens is fitted is provided at the distal end of the lens barrel 1101. A light source apparatus 1203 is connected to the endoscope 1100, and light generated by the light source apparatus 1203 is guided to the distal end of the lens barrel by a light guide extended inside the lens barrel 1101, and is emitted to an observation target in the body cavity of the patient 1132 via the objective lens. Note that the endoscope 1100 may be a forward-viewing endoscope or may be a forward-oblique viewing endoscope or side-viewing endoscope.

An optical system and an photoelectric conversion apparatus are provided in the camera head 1102, and reflected light (observation light) from the observation target is condensed by the optical system to the photoelectric conversion apparatus. The observation light is photoelectrically converted by the photoelectric conversion apparatus to generate an electrical signal corresponding to the observation light, that is, an image signal corresponding to an observation image. As the photoelectric conversion apparatus, the photoelectric conversion apparatus described in each of the above-described embodiments can be used. The image signal is transmitted as RAW data to a Camera Control Unit (CCU) 1135.

The CCU 1135 is formed by a Central Processing Unit (CPU), a Graphics Processing Unit (GPU), and the like, and comprehensively controls the operations of the endoscope 1100 and a display apparatus 1136. Furthermore, the CCU 1135 receives an image signal from the camera head 1102, and performs, for the image signal, various kinds of image processes such as development processing (demosaic processing) for displaying an image based on the image signal.

Under the control of the CCU 1135, the display apparatus 1136 displays the image based on the image signal having undergone the image processing by the CCU 1135. The light source apparatus 1203 is formed from a light source such as a Light Emitting Diode (LED), and supplies, to the endoscope 1100, irradiation light at the time of imaging an operation portion or the like. An input apparatus 1137 is an input interface to the endoscopic surgery system 1150. The user can input various kinds of information or instructions to the endoscopic surgery system 1150 via the input apparatus 1137. A treatment tool control apparatus 1138 controls driving of an energy treatment tool 1112 for ablation or incision of the tissue, sealing of a blood vessel, or the like.

The light source apparatus 1203 that supplies, to the endoscope 1100, irradiation light at the time of imaging an operation portion can be formed from, for example, a white light source formed by an LED, a laser light source, or a combination thereof. If the white light source is formed by a combination of RGB laser light sources, it is possible to accurately control the output intensity and output timing of each color (each wavelength), and thus the light source apparatus 1203 can adjust the white balance of a captured image. In this case, the observation target is time-divisionally irradiated with laser beams from the RGB laser light sources, respectively, and driving of the image sensor of the camera head 1102 is controlled in synchronism with the irradiation timings, thereby making it possible to time-divisionally capture images respectively corresponding to R, G, and B. In this method, it is possible to obtain a color image without providing color filters in the image sensor.

Driving of the light source apparatus 1203 may be controlled to change the intensity of light to be output for every predetermined time. It is possible to time-divisionally acquire images by controlling driving of the image sensor of the camera head 1102 in synchronism with the timing of changing the intensity of the light, and combine the images, thereby generating an image of a high dynamic range without so-called shadow detail loss or highlight detail loss.

The light source apparatus 1203 may be configured to supply light in a predetermined wavelength band corresponding to special light observation. In special light observation, for example, the wavelength dependency of light absorption in the body tissue is used. More specifically, by performing irradiation with light in a narrow band, as compared with irradiation light (that is, white light) at the time of normal observation, predetermined tissue such as a blood vessel in the mucous membrane surface layer is captured with high contrast. Alternatively, in special light observation, fluorescence observation for obtaining an image by fluorescence generated by performing radiation with excitation light may be performed. In fluorescence observation, it is possible to, for example, irradiate body tissue with excitation light and observe fluorescence from the body tissue, or locally inject a reagent such as indocyanine green (ICG) to body tissue while irradiating the body tissue with excitation light corresponding to the fluorescence wavelength of the reagent, thereby obtaining a fluorescence image. The light source apparatus 1203 can be configured to supply narrow band light and/or excitation light corresponding to such special light observation.

FIG. 27A exemplifies the configuration of a photoelectric conversion system formed as glasses 1600 (smartglasses). The glasses 1600 include a photoelectric conversion apparatus 1602 applied with the photoelectric conversion apparatus 100. The photoelectric conversion apparatus 1602 is the photoelectric conversion apparatus described in each of the above embodiments. A display apparatus including the light emitting apparatus such as an OLED or LED is provided on the back surface side of a lens 1601. One or a plurality of photoelectric conversion apparatuses 1602 may be provided. Alternatively, a plurality of kinds of photoelectric conversion apparatuses may be used in combination. The arrangement position of the photoelectric conversion apparatus 1602 is not limited to that shown in FIG. 27A.

The glasses 1600 further include a control apparatus 1603. The control apparatus 1603 functions as a power supply that supplies electric power to the photoelectric conversion apparatus 1602 and the above-described display apparatus. In addition, the control apparatus 1603 controls the operations of the photoelectric conversion apparatus 1602 and the display apparatus. An optical system configured to condense light to the photoelectric conversion apparatus 1602 is formed on the lens 1601.

FIG. 27B exemplifies the configuration of a photoelectric conversion system formed as glasses 1610 (smartglasses). The glasses 1610 include a control apparatus 1612, and a photoelectric conversion apparatus corresponding to the photoelectric conversion apparatus 1602 and a display apparatus are mounted on the control apparatus 1612. The photoelectric conversion apparatus in the control apparatus 1612 and an optical system configured to project light emitted from the display apparatus are formed in a lens 1611, and an image is projected to the lens 1611. The control apparatus 1612 functions as a power supply that supplies electric power to the photoelectric conversion apparatus and the display apparatus, and controls the operations of the photoelectric conversion apparatus and the display apparatus. The control apparatus may include a line-of-sight detection unit that detects the line of sight of a wearer. The detection of a line of sight may be done using infrared rays.

An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used. More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display apparatus according to the embodiment can include a photoelectric conversion apparatus including a light receiving element, and control a displayed image of the display apparatus based on the line-of-sight information of the user from the photoelectric conversion apparatus.

More specifically, the display apparatus decides a first visual field region at which the user is gazing and a second visual field region other than the first visual field region based on the line-of-sight information. The first visual field region and the second visual field region may be decided by the control apparatus of the display apparatus, or those decided by an external control apparatus may be received. In the display region of the display apparatus, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first visual field region and the second visual field region may be decided by the control apparatus of the display apparatus, or those decided by an external control apparatus may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target object ahead the line of sight from the image of the eyeball using the image of the eyeball and the direction of actual viewing of the eyeball in the image as supervised data. The AI program may be held by the display apparatus, the photoelectric conversion apparatus, or an external apparatus. If the external apparatus holds the AI program, it is transmitted to the display apparatus via communication.

When performing display control based on line-of-sight detection, smartglasses further including a photoelectric conversion apparatus configured to capture the image of the outside can preferably be applied. The smartglasses can display the captured outside image information in real time.

The photoelectric conversion apparatus 100 of each of the above embodiments may be applied to electronic equipment such as a smartphone or a tablet to be exemplified below. FIG. 28 is a view showing an example of the outer appearance of electronic equipment 120 on which the photoelectric conversion apparatus 100 formed as a solid-state image capturing apparatus is mounted. In FIG. 28, A shows the front surface side of the electronic equipment 120 and B shows the back surface side of the electronic equipment 120.

As shown in A of FIG. 28, a display 121 that displays an image is arranged at the center of the front surface of the electronic equipment 120. Then, front cameras 122-1 and 122-2 for each of which the photoelectric conversion apparatus 100 is used, an IR light source 123 that emits infrared rays, and a visible light source 124 that emits visible light are arranged along the upper side of the front surface of the electronic equipment 120.

As shown in B of FIG. 28, rear cameras 125-1 and 125-2 for each of which the photoelectric conversion apparatus 100 is used, an IR light source 126 that emits infrared rays, and a visible light source 127 that emits visible light are arranged along the upper side of the back surface of the electronic equipment 120.

By applying the above-described photoelectric conversion apparatus 100, the electronic equipment 120 having the above arrangement can capture, for example, an image of higher sensitivity. Note that the photoelectric conversion apparatus 100 can be applied to electronic equipment such as an infrared sensor, a distance measurement sensor using an active infrared source, a security camera, or a personal or biometric authentication camera. This can improve the sensitivity and performance of the electronic equipment. Furthermore, it is possible to reduce the power consumption of the system by reducing the light source electric power.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-000009, filed Jan. 1, 2022, and Japanese Patent Application No. 2022-000010, filed Jan. 1, 2022, which are hereby incorporated by reference herein in their entirety.

What is claimed is:

1. A photoelectric conversion apparatus including a semiconductor layer that includes a pixel array region having a plurality of pixels, and a peripheral region arranged on a periphery of the pixel array region, wherein the semiconductor layer has a first face and a second face, each pixel of the pixel array region includes a first semiconductor region of a first conductivity type arranged on a side of the first face, and a second semiconductor region of a second conductivity type arranged on a side of the second face, and a predetermined voltage that can cause an avalanche multiplication operation is supplied between the first semiconductor region and the second semiconductor region, the peripheral region includes a third semiconductor region of the first conductivity type arranged on the side of the first face, a fourth semiconductor region of the second conductivity type arranged apart from the third semiconductor region, and a fifth semiconductor region of the first conductivity type arranged, close to the third semiconductor region, between the third semiconductor region and the fourth semiconductor region, and an impurity concentration of the first conductivity type in the fifth semiconductor region is lower than an impurity concentration of the first conductivity type in the third semiconductor region, a voltage is supplied between the third semiconductor region and the fourth semiconductor region.

2. The apparatus according to claim 1, wherein the voltage supplied between the third semiconductor region and the fourth semiconductor region is the predetermined voltage.

3. The apparatus according to claim 1, wherein the fifth semiconductor region is arranged to surround the third semiconductor region.

4. The apparatus according to claim 1, wherein a depth of the third semiconductor region from the first face is equal to a depth of the first semiconductor region from the first face.

5. The apparatus according to claim 4, wherein a depth of the fourth semiconductor region from the first face is equal to a depth of the second semiconductor region from the first face.

6. The apparatus according to claim 1, further comprising a pinning layer arranged to be in contact with the second semiconductor region and the fourth semiconductor region.

7. The apparatus according to claim 1, wherein an isolation region of the second conductivity type is arranged between the pixel array region and the peripheral region.

8. The apparatus according to claim 7, wherein the fourth semiconductor region and the isolation region are electrically connected to each other.

9. The apparatus according to claim 7, wherein an insulating isolation portion is provided in the isolation region.

10. The apparatus according to claim 9, wherein the insulating isolation portion is arranged to extend through the semiconductor layer.

11. The apparatus according to claim 10, wherein the insulating isolation portion is arranged to electrically isolate the isolation region into a first isolation region on a side of the pixel array region and a second isolation region on a side of the peripheral region.

12. The apparatus according to claim 11, wherein a first electrically conductive path that applies a potential to the first isolation region and a second electrically conductive path that applies a potential to the second isolation region are provided in a wiring structure stacked on the semiconductor layer.

13. The apparatus according to claim 12, wherein the first electrically conductive path and the second electrically conductive path are electrically connected in the wiring structure.

14. The apparatus according to claim 7, wherein
a trench is formed in the isolation region, and
the apparatus further includes a pinning layer arranged to be in contact with the second semiconductor region and the fourth semiconductor region and to cover a surface of the trench.

15. The apparatus according to claim 7, wherein an isolation region of the second conductivity type is arranged between adjacent pixels among the plurality of pixels.

16. The apparatus according to claim 1, further comprising a light shielding film arranged on the second face, wherein the light shielding film is electrically connected to the fourth semiconductor region.

17. The apparatus according to claim 1, wherein a plurality of third semiconductor regions including the third semiconductor region are arranged at a predetermined pitch in the peripheral region, and the predetermined pitch is larger than an array pitch of the plurality of pixels.

18. A photoelectric conversion system comprising:

a photoelectric conversion apparatus defined in claim 1; and a signal processing unit configured to process a signal output from the photoelectric conversion apparatus.

19. A photoelectric conversion apparatus including a semiconductor layer that includes a pixel array region having a plurality of pixels, and a peripheral region arranged on a periphery of the pixel array region, wherein the semiconductor layer has a first face and a second face, each pixel of the pixel array region includes a first semiconductor region of a first conductivity type arranged on a side of the first face, and a second semiconductor region of a second conductivity type arranged on a side of the second face, and a predetermined voltage that can cause an avalanche multiplication operation is supplied between the first semiconductor region and the second semiconductor region, the peripheral region includes a third semiconductor region of the first conductivity type arranged on the side of the first face, and a fourth semiconductor region of the second conductivity type arranged apart from the third semiconductor region, and a voltage lower than the predetermined voltage is supplied between the third semiconductor region and the fourth semiconductor region.

\*   \*   \*   \*   \*